(12) United States Patent
Rodriguez et al.

(10) Patent No.: US 7,304,881 B2
(45) Date of Patent: Dec. 4, 2007

(54) FERROELECTRIC MEMORY WITH WIDE OPERATING VOLTAGE AND MULTI-BIT STORAGE PER CELL

(75) Inventors: John Anthony Rodriguez, Richardson, TX (US); Kezhakkedath R. Udayakumar, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/880,406

(22) Filed: Jun. 28, 2004

(65) Prior Publication Data
US 2004/0233744 A1 Nov. 25, 2004

Related U.S. Application Data

(62) Division of application No. 10/260,467, filed on Sep. 30, 2002, now Pat. No. 6,856,534.

(51) Int. Cl.
*G11C 11/22* (2006.01)

(52) U.S. Cl. .................. 365/145; 365/222; 365/205; 365/210; 365/189.07; 365/189.09

(58) Field of Classification Search ............. 365/145, 365/222, 205, 210, 189.07, 189.09
See application file for complete search history.

(56) References Cited

U.S. PATENT DOCUMENTS

| | | | |
|---|---|---|---|
| 5,815,439 A * | 9/1998 | Korsh et al. ........... 365/185.24 |
| 5,999,438 A | 12/1999 | Ohsawa | |
| 6,094,370 A * | 7/2000 | Takashima ................. 365/145 |
| 6,097,059 A | 8/2000 | Yamada | |
| 6,184,726 B1 * | 2/2001 | Haeberli et al. .............. 327/96 |
| 6,285,577 B1 | 9/2001 | Nakamura | |
| 6,704,218 B2 * | 3/2004 | Rickes et al. ............... 365/145 |
| 6,785,629 B2 * | 8/2004 | Rickes et al. ............... 702/118 |
| 6,816,398 B2 * | 11/2004 | Sakai et al. ................. 365/145 |
| 6,826,072 B2 * | 11/2004 | Takashima ................. 365/145 |
| 6,870,761 B2 * | 3/2005 | Johnson ..................... 365/158 |
| 6,870,773 B2 * | 3/2005 | Noguchi et al. ....... 365/185.22 |
| 6,924,998 B2 * | 8/2005 | Kang ......................... 365/145 |

(Continued)

FOREIGN PATENT DOCUMENTS

| JP | 41104558 A | 2/1999 |
|---|---|---|
| JP | 2002-230967 A | 8/2002 |

OTHER PUBLICATIONS

"A Survey of Circuit Innovations in Ferroelectric Random-Access Memories", Ali, Sheikholeslami and P. Glenn Gulak, Proceedings of the IEEE, vol. 88, No. 5, May 2000, pp. 667-689.
European Search Report, Application No. 03103626.2, Texas Instruments Inc., 3 pgs.

*Primary Examiner*—Viet Q. Nguyen
(74) *Attorney, Agent, or Firm*—Jacqueline J. Garner; W. James Brady, III; Federick J. Telecky, Jr.

(57) ABSTRACT

Apparatus and methods are described for a multi-level FeRAM memory device. Using write and read circuits associated with the memory device, multiple data states may be written to and read from the ferroelectric memory device which are associated with a single polarization direction, thereby allowing for a single cell to contain more than one bit of data.

6 Claims, 15 Drawing Sheets

U.S. PATENT DOCUMENTS

2002/0015323 A1   2/2002   Maruyama
2002/0027798 A1*  3/2002   Takashima .................. 365/145
2003/0094630 A1   5/2003   Bok Kang et al.
2003/0112650 A1*  6/2003   Kang ......................... 365/145
2003/0198077 A1   10/2003  Ueda et al.

* cited by examiner

| 1 Bit | $P_{sw}$, $P_{nsw}$ (uC/cm$^2$) | | Write V | Read V |
|---|---|---|---|---|
| "Data 0" | ~ $P_{sat}$ -$P_r$ (2V) | ~ 26 | $V_{PR}$ = 2V. | $V_{PR}$ = 2V. |
| "Data 1" | ~ $P_{sat}$ +$P_r$ (2V) | ~ 66 | $V_{PR}$ = 2V. | $V_{PR}$ = 2V. |

| 2 Bit | $P_{sw}$, $P_{nsw}$ (uC/cm$^2$) | | Write V | Read V |
|---|---|---|---|---|
| "Data 00" | ~ $P_{sat}$ -$P_r$ (1V) | ~ 17 | $V_{PR}$ = 1V. | $V_{PR}$ = 1V. |
| "Data 01" | ~ $P_{sat}$ -$P_r$ (2V) | ~ 26 | $V_{PR}$ = 2V. | $V_{PR}$ = 2V. |
| "Data 10" | ~ $P_{sat}$ +$P_r$ (1V) | ~ 51 | $V_{PR}$ = 1V. | $V_{PR}$ = 1V. |
| "Data 11" | ~ $P_{sat}$ +$P_r$ (2V) | ~ 66 | $V_{PR}$ = 2V. | $V_{PR}$ = 2V. |

400

| "1" P-terms = Switched charge ||||||
| Write V | Read Volts ||||| Assigned Data State |
| | 0.5 | 1.0 | 1.5 | 2.0 | 2.5 | |
|---|---|---|---|---|---|---|
| -0.5 | 8.1 | 24.7 | 41 | 51.6 | 56.8 | "Data 10" |
| -1.0 | 9.4 | 28.3 | 40.2 | 54.8 | 60 | |
| -1.5 | 9.8 | 30 | 43.3 | 56.7 | 62.3 | |
| -2.0 | 9.7 | 29.7 | 48.2 | 58 | 62.8 | |
| -2.5 | 9.7 | 30.2 | 49.6 | 59 | 63.6 | "Data 11" |

410

| "0" U-terms = Non-Switched charge ||||||
| Write V | Read Volts ||||| Assigned Data State |
| | 0.5 | 1.0 | 1.5 | 2.0 | 2.5 | |
|---|---|---|---|---|---|---|
| 0.5 | 6.8 | 20.3 | 32.9 | 38.3 | 42.5 | "Data 01" |
| 1.0 | 6.5 | 16 | 25.8 | 31 | 35.3 | |
| 1.5 | 6.5 | 15.3 | 23.4 | 29 | 33 | |
| 2.0 | 6.5 | 15.2 | 22.7 | 28 | 32 | |
| 2.5 | 6.5 | 15.1 | 22.5 | 27.5 | 31.5 | "Data 00" |

FERROELECTRIC MEMORY WITH WIDE OPERATING VOLTAGE AND MULTI-BIT STORAGE PER CELL

RELATED APPLICATION

This application divisional of Ser. No. 10/260,467 filed Sep. 30, 2002, now U.S. Pat. No. 6,856,534 which is entitled "Ferroelectric Memory with Wide Operating Voltage and Multi-Bit Storage Per Cell".

FIELD OF INVENTION

The present invention relates generally to semiconductor devices and more particularly to apparatus and methods for multiple bit data storage and retrieval in ferroelectric memory cells, while operating the cells over a wide voltage range in memory devices.

BACKGROUND OF THE INVENTION

Ferroelectric memory devices, and other types of semiconductor memories, are used for storing data and/or program code in personal computer systems, embedded processor-based systems, and the like. Ferroelectric memories are commonly organized in single-transistor, single-capacitor (1T1C) or two-transistor, two-capacitor (2T2C) configurations, in which data is read from or written to the device using address signals and various other control signals. The individual memory cells typically comprise one or more ferroelectric capacitors (FeCaps) adapted to store a binary data bit, as well as one or more access transistors, typically MOS devices, operable to selectively connect the FeCap to one of a pair of complimentary bit lines, with the other bit line being connected to a reference voltage. The individual cells are commonly organized as individual bits of a corresponding data word, wherein the cells of a given word are accessed concurrently through activation of plate lines and word lines by address decoding circuitry.

Ferroelectric memory devices provide non-volatile data storage where data memory cells include capacitors constructed with ferroelectric dielectric material which may be polarized in one direction or another in order to store a binary value. The ferroelectric effect allows for the retention of a stable polarization in the absence of an applied electric field due to the alignment of internal dipoles within perovskite crystals in the dielectric material. This alignment may be selectively achieved by application of an electric field to the ferroelectric capacitor in excess of the coercive field of the material. Conversely, reversal of the applied field reverses the internal dipoles. Although the polarization of each individual dipole is relatively small, the net polarization of several domains, each comprising a number of aligned dipoles, can be large enough for detection using, for example, standard sense amplifier designs. The gross effect of polarization is a nonzero charge per unit area of the ferroelectric capacitor that does not disappear over time.

A plot 10 of the characteristic hysteresis loop for a conventional ferroelectric capacitor is shown in FIG. 1A, and displays the total charge on the ferroelectric capacitor as a function of the applied voltage. Plot 10 illustrates the charge "Q" (Y-axis), and the voltage "V" (X-axis). Remanent charge ($Q_r$), saturation charge ($Q_s$), and coercive voltage ($V_c$) are three important parameters that characterize the loop. When the voltage across the capacitor is 0V, the capacitor assumes one of the two stable states: "0" 15, or "1" 20. The total charge stored on the capacitor is $Q_r$ for a "0" 15 or $-Q_r$ for a "1" 20. A "0" can be switched to a "1" by applying a negative voltage pulse across the capacitor. By doing so, the total charge on the capacitor is reduced by $2Q_r$, a change of charge that can be sensed by the sense amplifier (amp). Similarly, a "1" can be switched back to a "0" by applying a positive voltage pulse across the capacitor, hence restoring the capacitor charge to $+Q_r$.

Characteristic curve segment 25 represents the charge path of a FeCap from a "1" state 20, thru $V_{cc}$ as charge is applied, and then thru curve segment 30 to the other stable "0" state 15 as the voltage is relaxed to the FeCap. FIG. 1B is the schematic symbol 50 of the FeCap of FIG. 1A with capacitance $C_{FE}$, while the "+" and "−" signs beside the FeCap symbol represent the applied voltage polarity.

These characteristics are similar in some respects to those of a magnetic core memory cell except for the following: the hysteresis loop of a ferroelectric capacitor does not have sharp transitions around its coercive points: $-V_c$ and $+V_c$. This reflects a partial switching of electric domains in a ferroelectric capacitor, and further implies that even a voltage level that is half of $V_{cc}$ can disturb the state of the capacitor. As a result, it is difficult to access a ferroelectric capacitor in a cross-point array without disturbing the capacitors on the same row or column. Thus, many ferroelectric memory (FeRAM) cell designs include an access transistor in series with the FeCap.

Data in a ferroelectric memory cell is read by connecting a reference voltage to a first bit line, connecting the cell capacitor between a complimentary bit line and a plate line signal voltage, and interrogating the cell. There are several techniques to interrogate an FeRAM cell. Two most common interrogation techniques are step sensing and pulse sensing. In both these interrogation techniques, the cell capacitor is coupled to the complimentary bit line by turning ON an access or a pass gate transistor. In the step sensing, the plate line voltage is stepped from ground (Vss) to a supply voltage (Vdd). In the pulse sensing the plate line voltage is pulsed from Vss to Vdd and then back to Vss. This provides a differential voltage on the bit line pair, which is connected to a sense amp circuit. The reference voltage is typically supplied at an intermediate voltage between a voltage ($V_{\text{``0''}}$) associated with a capacitor programmed to a binary "0" 15 of FIG. 1A, and that of the capacitor programmed to a binary "1" ($V_{\text{``1''}}$) 20 (e.g., about ½ $V_{cc}$). The resulting differential voltage at the sense amp terminals represents the data stored in the cell, which is buffered and applied to a pair of local IO lines.

The transfer of data between the FeRAM, the sense amp circuit, and the local data bit lines is controlled by various access transistors, typically MOS devices, with switching signals being provided by control circuitry in the device. In a typical ferroelectric memory read sequence, two sense amp bit lines are initially pre-charged to ground, and then floated, after which a target ferroelectric memory cell is connected to one of the sense amp bit lines and interrogated. Thereafter, a reference voltage is connected to the remaining sense amp bit line, and a sense amp senses the differential voltage across the bit lines and latches a voltage indicative of whether the target cell was programmed to a binary "0" or to a "1".

In modern memory devices having millions of data cells, there is a continuing need to reduce component sizes and otherwise to conserve circuit area in the device, so as to maximize device density. Accordingly, memory cell layout architectures such as folded bit line configurations have been developed to conserve on the amount of die area needed to implement large scale memories, like 64 megabit or larger devices. Such devices are typically divided internally into blocks, sections, segments, rows and columns. For example, a 64M device may include 8 blocks of 8M each, each block may consist of 8 sections of 1M each, each section may be 32 segments, with each segment containing 512 words or rows of 64 bits or columns per word. When a data word is read, the cell data from the corresponding bit in each column is sensed using 64 individual sense amplifiers associated with the individual data cell columns.

As current trends continue, the need for increased levels of device integration and process scaling has also increased. One consequence of process technology scaling is the need for further lower voltage operation of devices as scaling continues downward. In particular, there is a need for low voltage operation of CMOS circuits. Additionally, future products may require integration of large amounts of on-chip (embedded) memory. However, few memory structures allow low voltage operation.

SRAM and DRAM, for example, have been thoroughly explored. 6-T SRAM generally requires a very "large area" by comparison to DRAM, Flash, or FeRAM. DRAM typically has a high power consumption, which makes DRAM fairly incompatible with the increasing demand for low power applications.

Attempts to scale the dielectric layer of Flash memory have proven to be difficult or impossible to scale due to degradation of the coupling ratio. Although Flash memories are available with "two bits per cell" allowing a 2× density increase with some penalty of increased sensing circuitry area, Flash also requires high voltages for the program and erase memory operations.

As indicated, these memory technologies are not perfect and result in only marginal improvement, and may also be difficult to implement, particularly while scaling down the technologies and the operating voltage in memory devices. Thus, there is a need for improved apparatus and methods for multiple bit data storage and retrieval in ferroelectric memory cells, while operating the cells over a wide voltage range in memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

A multi-bit ferroelectric memory device is disclosed, comprising an FeRAM cell having an FeCap and an access transistor coupleable to a data bit line. The memory device also has a program and read pulse generator, which is operable to produce a program pulse during a write memory operation for storing data in one of a plurality of switched and non-switched polarization charge levels in the FeRAM. Hereinafter the "plurality of switched and non-switched polarization charge levels" will be generally referred to as "a plurality of polarization charge levels". A multi-level sense amp circuit is coupleable to the data bit line during a read operation to sense a differential voltage whose magnitude corresponds to one of the plurality of polarization charge levels stored in the ferroelectric memory cell. In this way multiple bits of data may be stored in and retrieved from a single ferroelectric memory cell.

One aspect of the invention provides a ferroelectric memory device comprising one or more ferroelectric memory cells connected to one of a first and second data bit line and to a program and read pulse generator during a write operation. The program and read pulse generator may be employed, for example, to produce a program pulse, which when applied to the FeRAM ferroelectric capacitor, charges the FeCap to a switched polarization charge level (magnitude) which corresponds to one of a plurality of data states. In this way multiple bits of data may be stored in a single ferroelectric memory cell. A multi-level sense amp is provided, wherein the sense amp couples a first data bit line to the ferroelectric memory cell, and a second data bit line to a reference voltage. The multi-level sense amp may be employed, for example, during a read operation to sense a differential voltage whose magnitude corresponds to one of the plurality of polarization charge levels stored in the ferroelectric memory cell. In this way multiple bits of data may be retrieved from a single ferroelectric memory cell.

Optionally, in another aspect of the invention, a refresh circuit may be added to initiate a refresh operation comprising a restore (read and write) memory operation of the memory cell after a predetermined time period, wherein one of the plurality of program voltages and the reference voltage is used in the refresh operation, thereby periodically refreshing the memory cell data. By refreshing the memory cell data periodically, polarization charge levels which may be below the polarization saturation level of the FeCap are maintained at levels without a loss of data.

Thus, the invention may be employed to reduce the effective area required for memory storage, while avoiding the increased power requirements, and higher voltage problems experienced in some conventional designs. Moreover, the invention may be employed in memory structures enabling low voltage operation.

Another aspect of the invention provides a ferroelectric memory device comprising one or more ferroelectric memory cells connected to one of a first and second data bit line and to a program and read pulse generator during a write operation. The program and read pulse generator may be employed, for example, to produce a program pulse, which when applied to the FeRAM ferroelectric capacitor, charges the FeCap to a switched polarization charge level which corresponds to one of a plurality of data states. In this way multiple bits of data may be stored in a single ferroelectric memory cell. A multi-level sense amp is provided, where the sense amp couples the first data bit lines to the ferroelectric memory cell, and the second data bit line to a reference voltage generator operable, for example, to produce one of a plurality of reference voltages for the sense amp. The multi-level sense amp may be employed, for example, during a read operation to sense a differential voltage whose magnitude corresponds to one of the plurality of polarization charge levels stored in the ferroelectric memory cell. In this way multiple bits of data may be retrieved from a single ferroelectric memory cell.

In another optional aspect of the invention, a refresh circuit may be added to initiate a refresh operation comprising a restore memory operation of the memory cell after a predetermined time period, wherein the program pulse and one of the plurality of reference voltages are used in the refresh operation, thereby periodically refreshing the polarization charge levels to original levels to avoid loss of data.

Yet another aspect of the invention provides a memory device, wherein the program and read pulse generator is operable to produce one of a plurality of program pulse voltages, pulse widths, pulse polarities, and pulse counts during a write memory operation, wherein one of a plurality of polarization charge levels is stored in the ferroelectric memory cell corresponding to a data state.

In one implementation, the program and read pulse generator and the FeRAM are initially coupled to the first data bit line, and a plate line of the FeCap is coupled to, for example, Vss or ground. The program pulse is applied to the FeRAM to charge the FeCap to one of the plurality of polarization charge levels corresponding to one of a multi-bit data states. Thereafter, the data bit line is decoupled from the program and read pulse generator and the FeRAM. Thus, a single ferroelectric memory cell may store multiple bits of data in one of the plurality of polarization charge levels.

Another aspect of the invention provides methods for sensing data from a ferroelectric memory cell in a memory device, comprising coupling the memory cell to a first data bit line and to a multi-level sense amp, while a second data bit line is coupled to the sense amp and a reference voltage. The multi-level sense amp circuit senses the differential voltage applied across the bit lines between the reference voltage and the voltage produced by the polarization charge on the FeCap, wherein the state of the stored data may be determined based on the magnitude of the differential voltage corresponding to one of the plurality of polarization charge levels stored in the ferroelectric memory cell.

Thereafter, the first data bit line is decoupled from the sense amp and the FeRAM, and the second data bit line is decoupled from the reference voltage and the sense amp second bit line. Thus, the invention may be employed to retrieve multiple bits of data from a single ferroelectric memory cell.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 7A is a table illustrating various switched (P) and non-switched (U) charge levels which may be read at one of five read voltages from an FeRAM memory cell, subsequent to programming the cell with one of five write voltages, including four data states assigned to two exemplary write voltages at the switched and non-switched polarization states, and as illustrated in the two curves of FIG. 6A, the table aiding the identification of voltage ranges with sufficient charge separation for adequate sensing of an exemplary multi-level FeRAM memory device in which various aspects of the present invention may be carried out;

DETAILED DESCRIPTION OF THE INVENTION

Figure 1A:
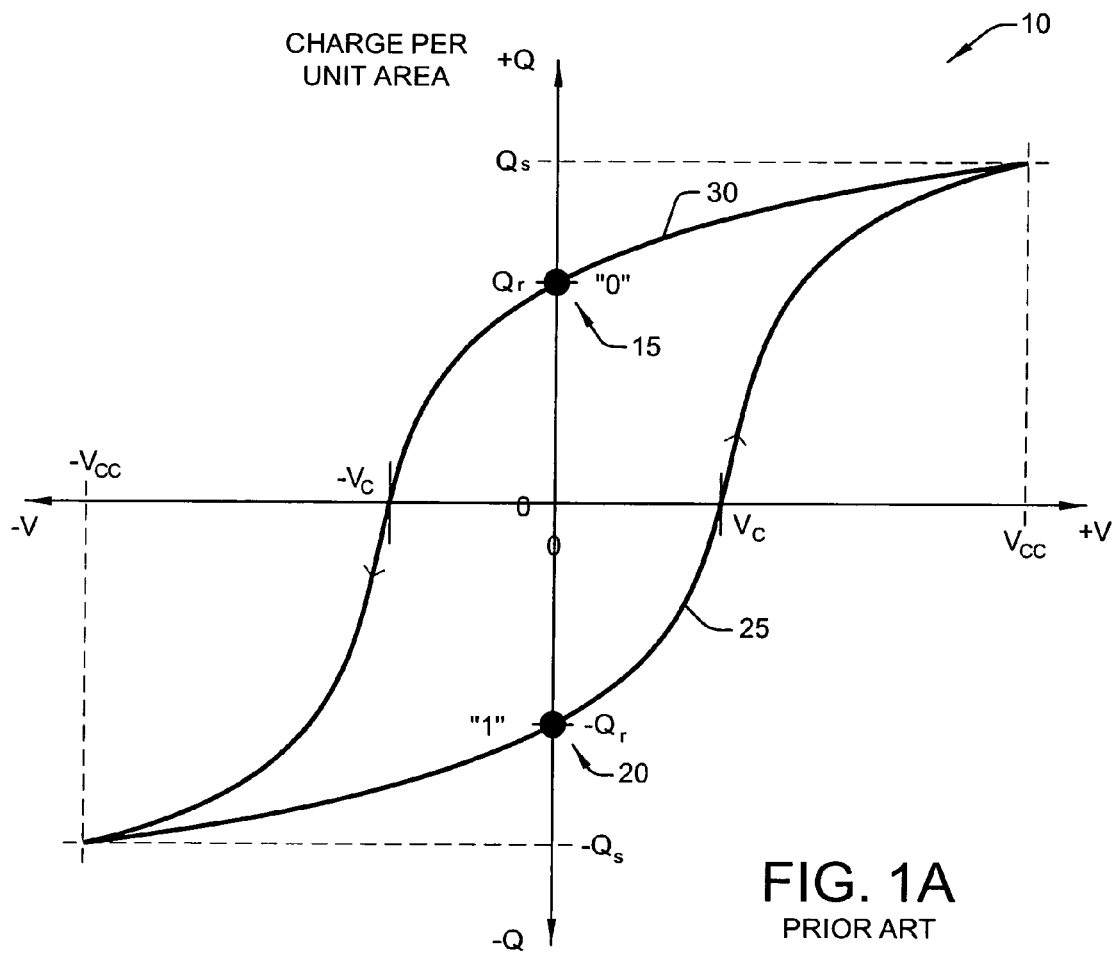
FIG. 1A is a characteristic curve plot of the ferroelectric capacitor, illustrating the charge "Q" (y-axis), and the voltage "V" (x-axis), including a characteristic placement relationship of a "1" state and a "0" state in a typical FeCap.
Figure 1B:
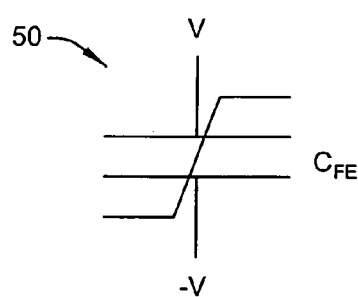
FIG. 1B is an accompanying schematic symbol of the Ferroelectric capacitor of FIG. 1A, and a typical voltage direction applied across the FeCap.

The present invention will now be described with reference to the attached drawings, wherein like reference numerals are used to refer to like elements throughout. The invention relates to memory apparatus and methodologies, which may be employed in write and read operations of a multi-level FeRAM memory device. One or more exemplary implementations of the various aspects of the invention are hereinafter illustrated and described in the context of ferroelectric memory devices comprising single transistor, single ferroelectric capacitor (1T1C) memory cells organized in folded bit line architectures.

In the above exemplary architecture, a program pulse is coupled with the memory cell during a write operation to store data in the FeCap as one of a plurality of switched and non-switched polarization charge levels (polarization charge levels, or magnitudes). During a read operation, a multi-level sense amp circuit is coupled to the first and second data bit lines with the ferroelectric memory cell (being sensed) coupled to the first data bit line and a reference voltage coupled to the second data bit line. The multi-level sense amp circuit senses the differential voltage across the data bit lines, whereby one of the plurality of data states may be determined based on the magnitude of the differential voltage corresponding to one of the plurality of polarization charge levels stored in the ferroelectric memory cell. In this way, multiple bits of data may be stored in, and retrieved from a single ferroelectric memory cell. However, it will be appreciated by those of ordinary skill in the art that the invention is not limited to such ferroelectric memory applications, and that the illustrations and descriptions provided herein are exemplary in nature.

The inventors have found that a FeRAM memory cell may be operated over a wide voltage range employing the present invention, permitting scaling down the dimensions and the operating voltage in memory devices. Further, by storing multiple states in a single cell, memory densities may be improved.

These and other properties of the FeCap will be now be explored in connection with the following figures and the present invention as it may be employed to store and retrieve multiple data states from an FeRAM memory cell in a multi-level FeRAM memory device.

Figure 2:
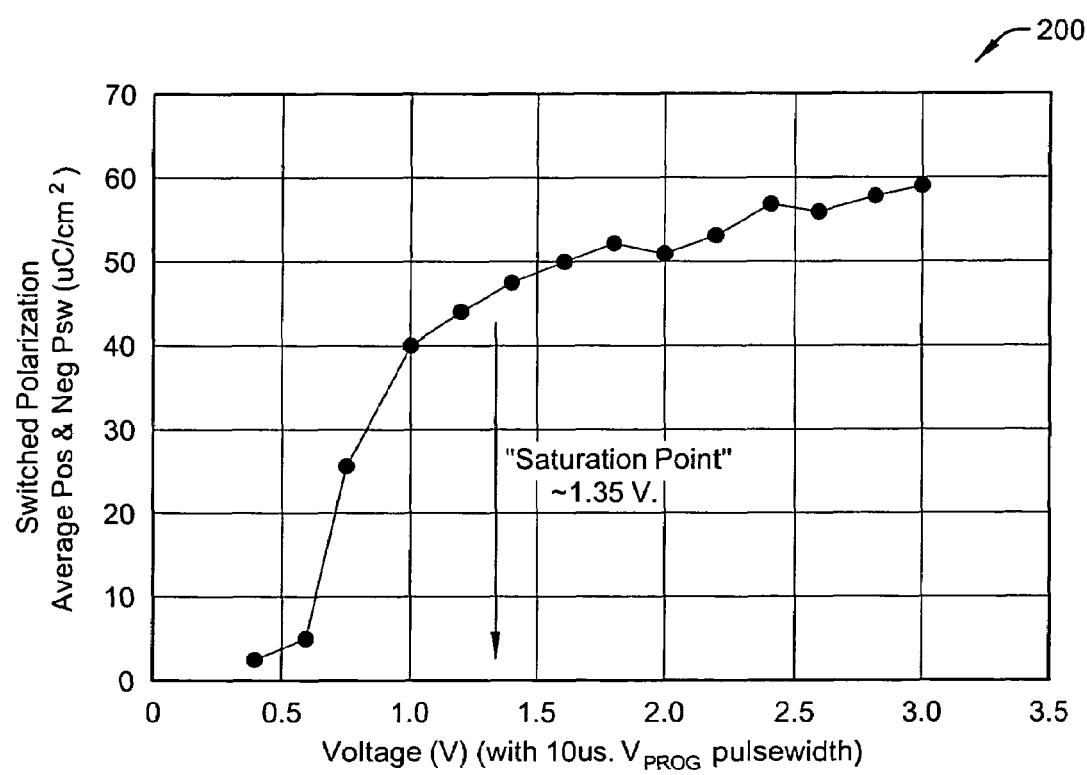
FIG. 2 is a switched polarization response plot illustrating an average switched polarization in charge per unit area (y-axis), and the voltage (x-axis) of a 10 us program pulse applied to an FeRAM memory cell, and showing an ability to program an FeCap to different charge levels, in accordance with the present invention.

For example, FIG. 2 is a switched polarization response plot 200, illustrating the average switched polarization ($P_{sw}$) in charge per unit area (in $uC/cm^2$) on the y-axis, and the voltage on the x-axis of a 10 us program pulse applied to an FeRAM memory cell. In this example, an FeCap is charged (switch polarized) to various charge densities with a fixed width (e.g., 10 us) program pulse of variable pulse amplitude. Plot 200 demonstrates the ability of an FeRAM memory cell to be programmed to different switched polarization charge levels (magnitudes). For example, when a 1 volt amplitude program pulse with a 10 us pulsewidth is applied to a 90 nm PZT FeCap, the average switched polarization charge density measures about 40 $uC/cm^2$. The average switched polarization charge density is the mathematical average of the positive and negative polarity direction measurements of the charge density. Although the differences between the positive and negative polarity measurements are relatively small, and the charge density of an FeCap should be generally "polarity neutral", the average was shown here, to slightly better characterize the FeCap.

Plot 200 also shows that at about 1.8 volts and a charge density of about 52 $uC/cm^2$, the response tends to plateau or saturate, to generally indicate a "saturation point" of the FeCap. Above the saturation point, an incremental increase in the amplitude of an applied voltage pulse produces little change in the charge density of the FeCap. Typically, in conventional FeRAM memory devices, only the voltages and charge levels at or above the saturation point are used for programming memory cells, as these higher voltages enable the beneficial non-volatile memory characteristics of the ferroelectric capacitor. In contrast however, as will be discussed in conjunction with the present invention, a wider range of voltages and charge levels may also be employed below and above the saturation point of a given FeCap, to permit multiple bits of data to be stored in one of a plurality of polarization charge levels.

Switched polarization response plots can be generated which illustrate the positive switched polarization in charge per unit area (y-axis), and the pulsewidth (x-axis) for programming pulses of different voltage magnitudes applied to an FeRAM memory cell. For example, when a 1 volt amplitude program pulse with a 900 ns pulsewidth is applied to a 90 nm PZT FeCap, the positive switched polarization charge density which is subsequently measured during a read operation will be a first value. If, however, a 1.5 volt program pulse of the same pulsewidth is applied to the FeCap, a different charge density of a second value results.

Thus, two different program voltages may be used in association with the apparatus and methods of the present invention, to charge an FeCap to two different switch polarization charge levels $P_{sw}$ to represent two different stored data states. Similarly, according to another aspect of the invention, any one of a number of switch polarization charge levels $P_{sw}$, may be stored in the FeCap to represent any number of data states to potentially further increase the memory density.

At this point, it should be appreciated that an FeCap employed in the present invention, may be charged to various charge densities, for example, using one or a combination of fixed or variable program pulse amplitudes, pulse duty cycles, pulsewidths, and polarities.

Figure 3:
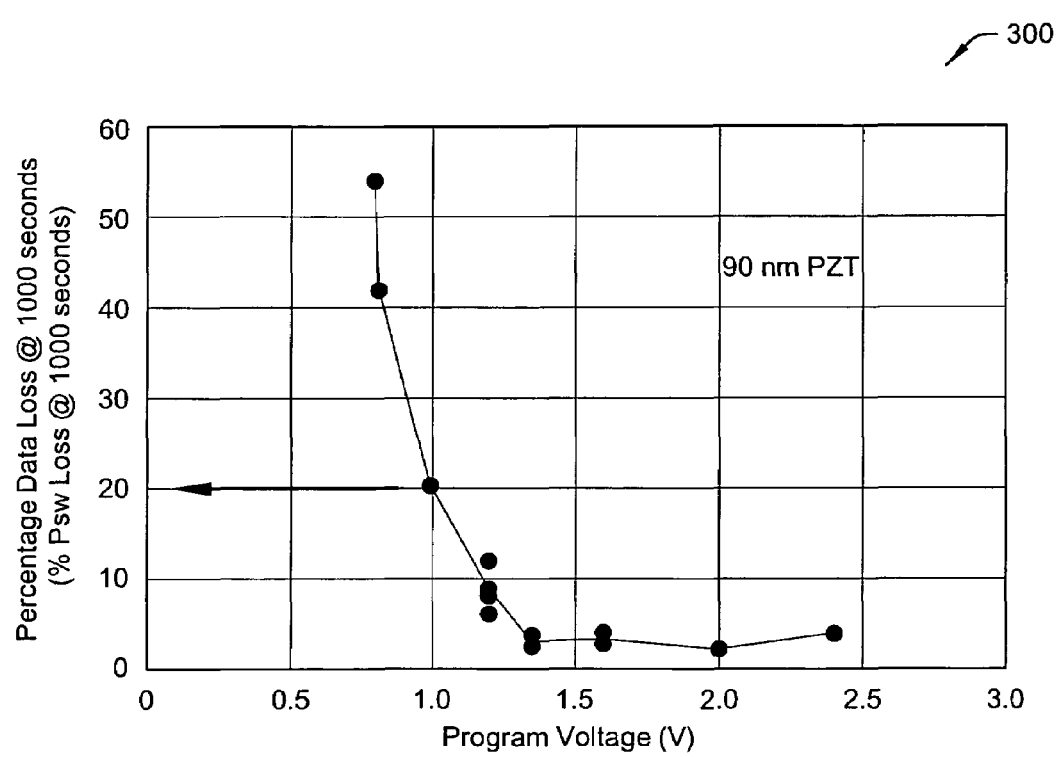
FIG. 3 is a plot illustrating a percentage of switched polarization charge that is lost after 1000 seconds in % $P_{SW}$ loss (y-axis), and a program voltage (x-axis) applied to an FeRAM memory cell, and demonstrating a strong voltage dependence of the cell used in a ferroelectric memory device in accordance with the present invention.

FIG. 3 is a plot illustrating a percentage of switched polarization charge that is lost after 1000 seconds as a function of the program voltage of an FeRAM memory cell. Plot 300 illustrates the % of $P_{sw}$ loss on the y-axis, and the program voltage applied to the cell on the x-axis. Plot 300 demonstrates a program voltage dependence of the ferroelectric memory cell with respect to data loss. For example, 1000 seconds after a 90 nm PZT FeRAM memory cell was programmed with a 1 volt amplitude program pulse of fixed pulsewidth, the cell was read using the same voltage in a read pulse, thereafter a measurement of the switched polarization charge indicated a $P_{sw}$ loss of about 20%. Note, that a specific charge density stored in an FeCap, will result in a specific charge level which may then be sensed on the FeCap, as a corresponding voltage at a sense amplifier input.

Further, the response of the particular FeRAM memory cell of FIG. 3, illustrates that any program (write) voltages below about 1.35 volts appear to be somewhat volatile, and thus may require a refresh circuit to avoid actually losing data. If, for example, a 20% loss of charge was acceptable before a refresh is required, as discussed above with the 1 volt memory operations, a refresh would only be needed once every 1000 seconds. Even a refresh rate of, for example, 100 seconds may save significant power in a memory device and provide very low voltage operation in a DRAM-like circuit for the FeRAM. In such instances then, a wider range of program voltages may be employed to program an FeCap, thus allowing multiple data bits to be stored in a single cell.

Figure 4:
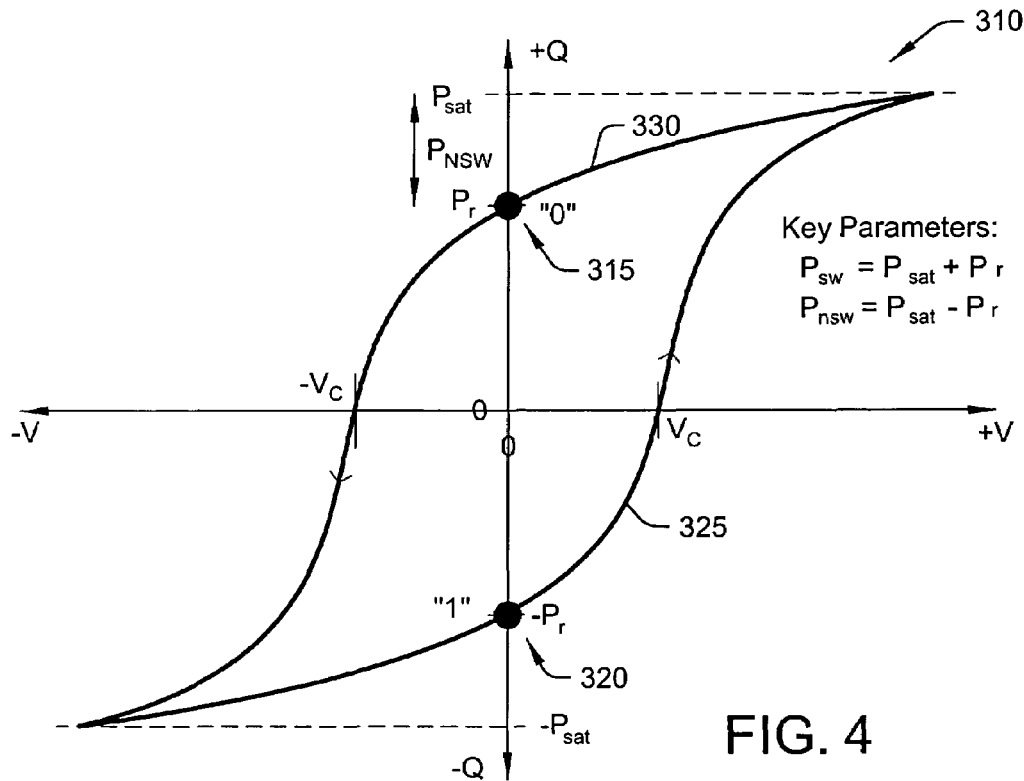
FIG. 4 is a characteristic curve plot of a ferroelectric capacitor, illustrating a polarization charge density "Q" (y-axis), and a program voltage "V" (x-axis), including several characteristic parameters of the cell used in a ferroelectric memory device in accordance with the present invention.

FIG. 4 is another characteristic curve plot of a ferroelectric capacitor, illustrating the polarization charge density "Q" (y-axis), and the program or read voltage "V" (x-axis). The plot 310 also includes several key characteristic parameters of the cell used in a ferroelectric memory device in accordance with the present invention. Specifically, $P_{sat}$ and $-P_{sat}$ are the positive and negative polarization saturation points, respectively, of the FeCap established by process parameters and the maximum voltage applied to the FeCap memory cell. $P_r$ and $-P_r$ identify the polarization relaxation points, which establish final relaxed data states of the cell at "0" 315, and "1" 320. If, for example, the cell is programmed with a positive voltage write pulse, such that $P_{sat}$ is achieved, traversing line segment 325, the cell will then relax to $P_r$ to indicate a "0" data state 315. If the cell is programmed with a negative voltage write pulse, such that $-P_{sat}$ is achieved, traversing line segment 330, the cell will then relax to $-P_r$ to indicate a "1" data state 320.

Subsequently, when the "0" data state 315 memory cell is read by application of a positive read pulse to the plate line associated with the FeCap, $P_{nsw}$ indicates the non-switched polarization charge, which is sensed by a sense amp; or:

$$P_{nsw} = P_{sat} - P_r \quad (1)$$

Conversely, when the "1" data state 320 memory cell is read by application of a positive read pulse, $P_{sw}$ indicates the switched polarization charge, which is sensed by a sense amp; or:

$$P_{sw} = P_{sat} + P_r \quad (2)$$

Equation (2) of the switched polarization "1" data state 320, indicates the greater charge which is read sensed of the two data states.

Figure 5:
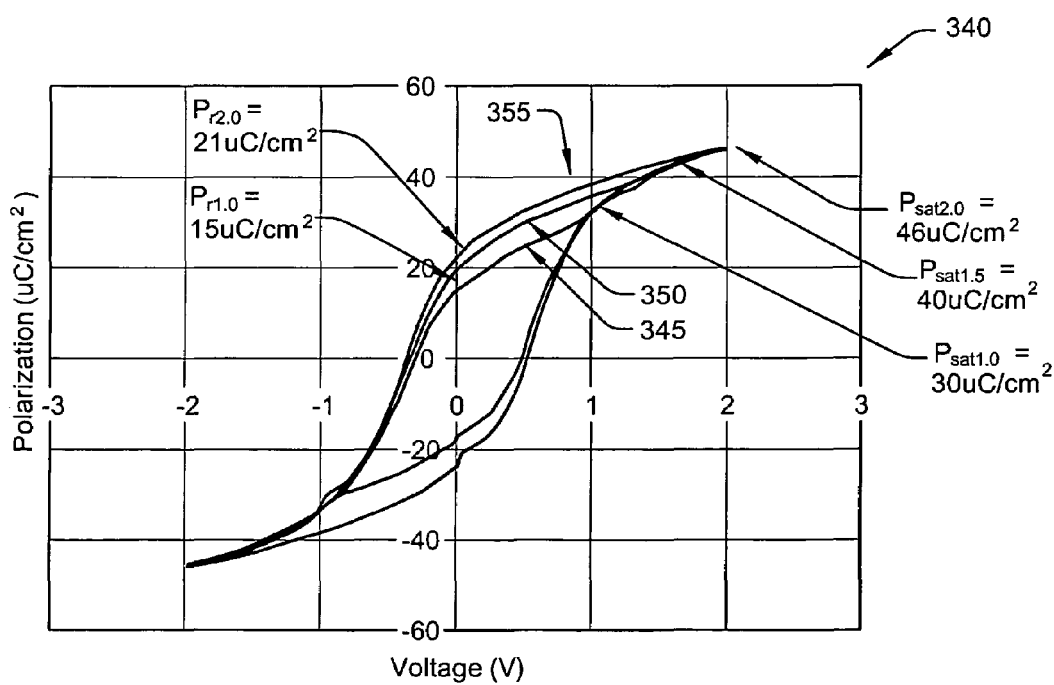
FIG. 5 is a family of three characteristic curve plots of the ferroelectric capacitor, illustrating a polarization charge density "Q" (y-axis), and a program voltage "V" (x-axis) which are produced in response to a 1 volt, 1.5 volt, and a 2.0 volt program pulse applied to an FeRAM memory cell, including three different charge densities and three corresponding saturation charge levels an FeCap may be programmed to, in a ferroelectric memory device in accordance with the present invention.

FIG. 5 is a family of three characteristic curve plots of the ferroelectric capacitor, illustrating the polarization charge density "Q" (y-axis), and the program or read voltage "V" (x-axis) in a ferroelectric memory device in accordance with the present invention. The curves of plot 340 are produced in response to a 1 volt 345, 1.5 volt 350, and a 2.0 volt 355 program pulse of fixed pulsewidth applied to an FeRAM memory cell manufactured by the (e.g., 90 nm CVD PZT film) process. When the FeCap is programmed with one of the three write voltages $V_{PR}$ (e.g., program or read voltage), three different charge densities may be established in the FeCap, corresponding with three different polarization saturation charge levels $P_{sat}$ and three different polarization relaxation levels $P_r$.

Exemplary parameter data points derived from the testing yielded:

| | | |
|---|---|---|
| $V_{PR1.0}$ = 1.0 V | $P_{r1.0}$ = 15 uC/cm$^2$ | $P_{sat1.0}$ = 30 uC/cm$^2$ |
| $V_{PR1.5}$ = 1.5 V | $P_{r1.5}$ = 20 uC/cm$^2$ | $P_{sat1.5}$ = 40 uC/cm$^2$ |
| $V_{PR2.0}$ = 2.0 V | $P_{r2.0}$ = 21 uC/cm$^2$ | $P_{sat2.0}$ = 46 uC/cm$^2$ |

Figures 6A, 6B, 6C:
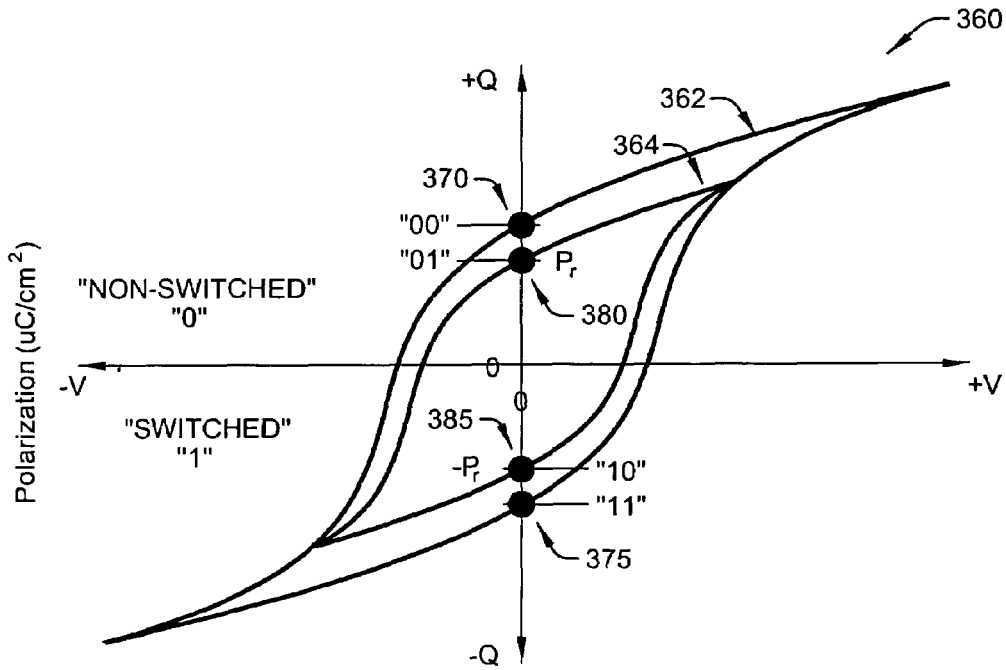
FIG. 6A is a plot of a family of two characteristic hysteresis curves of a ferroelectric capacitor, illustrating a polarization charge density "Q" (y-axis), and a program voltage "V" (x-axis) produced by two different voltage program pulses applied to an FeRAM memory cell, including four data states corresponding to four different polarization charge levels which an FeCap may be programmed to, in a multi-bit ferroelectric memory device in accordance with the present invention.
FIG. 6B is a table illustrating data states, charge density levels, and programming and read voltages associated with an exemplary one bit multi-level FeRAM memory device in which various aspects of the present invention may be carried out.
FIG. 6C is a table illustrating data states, charge density levels, and programming and read voltages associated with an exemplary two bit multi-level FeRAM memory device in which various aspects of the present invention may be carried out.

FIG. 6A is a plot of a family of two characteristic hysteresis curves of the ferroelectric capacitor, illustrating the polarization charge density "Q" (y-axis), and the program voltage "V" (x-axis) which were produced by two different voltage program pulses applied to an FeRAM memory cell of a multi-bit ferroelectric memory device in accordance with the present invention. The plot 360 is similar to that of FIG. 5, but includes four data states corresponding to four different polarization charge levels which the FeCap may be programmed to using the two write voltage pulses. Again, each characteristic curve for a given programming voltage has a non-switched "0" state (upper half of the curve) and a switched "1" state (lower half of the curve), as indicated on FIG. 6A.

Further, if multiple (e.g., two, three, multiple) voltages are used to program the memory cells, and produce multiple (e.g., two, three, multiple) polarization charge levels, then a corresponding number of data states may also be represented. For example, a 2 volt write voltage curve 362, and a 1 volt write voltage curve 364, may be used together to establish a 2 bit memory cell from a single conventional FeCap, according to an aspect of the invention. The non-switched polarization portion of the 2 volt curve may be somewhat arbitrarily assigned the "00" data state 370, and the switched polarization portion of the 2 volt curve assigned the "11" data state 375, while the non-switched polarization portion of the 1 volt curve may be assigned the "01" data state 380, and the switched polarization portion of the 2 volt curve assigned the "10" data state 385.

FIG. 6B is a table 390 illustrating the data states, charge density levels, and the programming and read voltages of an exemplary one bit single level FeRAM memory device. FIG. 6B uses the charge density data points derived from the 2 volt curve of FIG. 5 in the $P_{nsw}$ and $P_{sw}$ formulas (1) and (2)

discussed above, to obtain the sensed charge levels shown, and are assigned the "0" and "1" data states, respectively, as shown in FIG. 5A.

Substituting these values we have:

$P_{nsw}=P_{sat}-P_r=46-21=25$ uC/cm$^2$  from (1)

$P_{sw}=P_{sat}+P_r=46+21=67$ uC/cm$^2$  from (2)

In this example, the write and read voltages (e.g., 2 volts) are generally about the same for both voltages. Programming the FeRAM memory cell of this example with the 2 volt write pulse, typically produces non-volatile data storage. However, a more advantageous low voltage operation (e.g., with a 1 volt write and read pulse) may be realized, when used in combination with a DRAM-like refresh circuit which produces a long refresh time in accordance with an aspect of the present invention.

By contrast to the single level FeRAM memory cell of FIG. 6B, table 395 of FIG. 6C illustrates the data states, charge density levels, and the programming and read voltages of an exemplary two bit multi-level FeRAM memory device in accordance with an aspect of the present invention. FIG. 6c uses the charge density data points derived from the 1 volt and 2 volt curves of FIG. 5 in the $P_{nsw}$ (1) and $P_{sw}$ (2) formulas discussed above, to obtain the sensed charge levels shown, and are assigned the four data states shown in FIG. 6A.

Substituting these values we have:

at $1V\ P_{nsw1.0}=P_{sat}-P_r=30-15=15$ uC/cm$^2$  from (1)

at $2V\ P_{nsw2.0}=P_{sat}-P_r=46-21=25$ uC/cm$^2$  from (1)

at $1V\ P_{sw1.0}=P_{sat}+P_r=30+15=45$ uC/cm$^2$  from (2)

at $2V\ P_{sw2.0}=P_{sat}+P_r=46+21=67$ uC/cm$^2$  from (2)

Thus, one of 4 states may be programmed into the FeCap with the 2 voltages for two bit multi-level memory storage. When the cell is subsequently read sensed with the same voltage that was used to program the cell, the charge levels shown above and in table 395 of FIG. 6C are produced. The charge levels indicated, demonstrate a clean charge separation between the data states for simple read sensing in a sense amp. Note that in FIG. 6C read voltage values that matched the program voltage values were employed primarily for characterization and illustration purposes, and it is understood that in practice reading FeRAM cells using different read voltages would not be employed.

However, as the read operation of the FeRAM memory cell is typically destructive, and it may not be known during a read of a multi-level memory device, which write voltage was used, a single read voltage which still provides the widest possible charge separation between the data states assigned is preferred.

For example, FIG. 7A is a table illustrating various switched (P) and non-switched (U) charge levels which may be read at one of five read voltages from an FeRAM memory cell. The polarization charge levels shown in table 400 of FIG. 7A, may be read subsequent to programming the cell with a one of five write voltages. Table 400 further highlights four data states which are assigned to two exemplary write voltages (e.g., the lowest 0.5 V, and the highest 2.5 V levels) at the switched and non-switched polarization states, and as illustrated in the two curves of FIG. 6A. Table 400 aids in the identification of voltage ranges with sufficient charge separation for adequate sensing of an exemplary multi-level FeRAM memory device in which various aspects of the present invention may be carried out. For example, a 1.5 volt read voltage is identified midway between the lowest 0.5 V, and highest 2.5 V write and read voltage levels, with a wide charge separation between the four data states, particularly when the 0.5 V and 2.5 V write voltages are chosen at both the P & U charge levels.

It should be understood that the data provided herein is merely exemplary, and that the invention is applicable to other types of FeCaps and various program and read voltages. It should be further appreciated that with further optimization, that additional polarization charge levels may be repeatably established with sufficient charge separation to provide for even more data states in a given FeCap, and such variations are contemplated as falling within the scope of the present invention.

The switched charge levels 410 and the non-switched charge levels 420 in FIG. 7A for a 1.5 volt read operation, using data states assigned to the 0.5 V, and 2.5 V write voltages are, for example:

"Data 00"=$P_{nsw2.5}$~22.5 uC/cm$^2$

"Data 01"=$P_{nsw0.5}$~32.9 uC/cm$^2$

"Data 10"=$P_{sw0.5}$~41.0 uC/cm$^2$

"Data 11"=$P_{sw2.5}$~49.6 uC/cm$^2$

As shown above and in table 400, the exemplary charge levels have about 8–10 uC/cm$^2$ separation between each data state, and are believed to provide adequate charge separation levels for sensing. In the present process using the sample 90 nm PZT FeRAM memory cell, each 1 uC/cm$^2$ also provides about 8–10 mV of sensing voltage, yielding approximately the following differential sense voltages:

"Data 00"=$P_{nsw2.5}$~22.5 uC/cm$^2$ ~225 mV

"Data 01"=$P_{nsw0.5}$~32.9 uC/cm$^2$ ~329 mV

"Data 10"=$P_{sw0.5}$~41.0 uC/cm$^2$ ~410 mV

"Data 11"=$P_{sw2.5}$~49.6 uC/cm$^2$ ~496 mV

Thus, if an FeRAM memory cell is programmed with one of two write voltages, four data states may be assigned to correspond to the four polarization charge levels which result, to provide a two bit multi-level FeRAM memory device in accordance with the present invention.

In another example from the data of table 400 and in accordance with the present invention, if about 3.2 uC/cm$^2$ provides an adequate level of charge separation for sensing between each data state, then a three bit multi-level FeRAM memory device may be provided. One of three write voltages (e.g., .5 V, 1.0 V, and 2.5 V) may be used to program the FeRAM memory cell, while either the 2.0 V or the 2.5 V read voltage may be used with similar sensing results. In this example, the three write voltages provide 6 potential data states. With a 2.5V read voltage these yield:

"Data 000"=$P_{nsw2.5}$~31.5 uC/cm$^2$ ~315 mV

"Data 001"=$P_{nsw1.0}$~35.3 uC/cm$^2$ ~353 mV

"Data 010"=$P_{nsw0.5}$~42.5 uC/cm$^2$ ~425 mV

"Data 011"=$P_{sw0.5}$~56.8 uC/cm$^2$ ~568 mV

"Data 100"=$P_{sw1.0}$~60.0 uC/cm$^2$ ~600 mV

"Data 101"=$P_{sw2.5}$~63.6 uC/cm$^2$ ~636 mV

Note, four voltages would be required to provide 8 data states for a full three bits of binary data. Thus, in the previous example using three write voltages, 6 data states are provided, for the equivalent of 2½ bits of binary data.

Figure 7B:
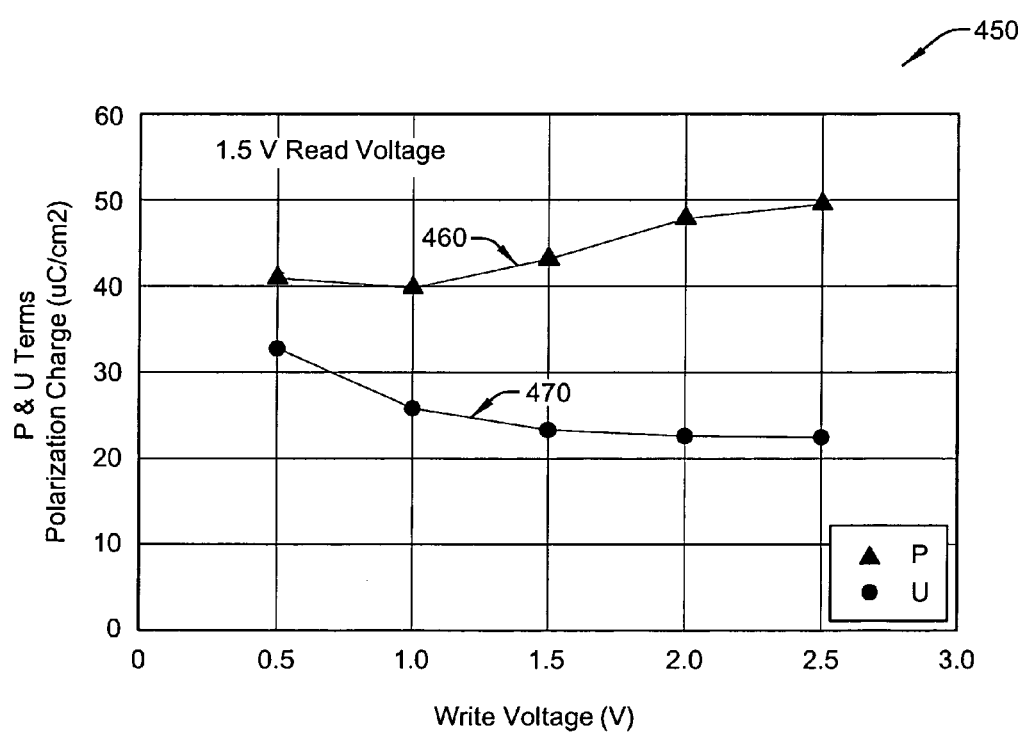
FIG. 7B is a plot illustrating the five switched (P) and non-switched (U) charge levels which may be read at the 1.5 volt read voltage from an FeRAM memory cell, subsequent to programming the cell with each of the five write voltages illustrated in the table of FIG. 7A, the plot curves further aiding an identification of write voltages at a median read voltage with sufficient charge separation for adequate sensing of an exemplary multi-level FeRAM memory device in which various aspects of the present invention may be carried out.

FIG. 7B is a plot 450 illustrating two curves comprising the five switched (P) 460, and non-switched (U) 470 charge levels which may be read at the 1.5 volt read voltage from an FeRAM memory cell, subsequent to programming the cell with each of the five write voltages illustrated in the table of FIG. 7A. The curves of plot 450 further aid the identification of write voltages at a median read voltage (e.g., 1.5 V) with sufficient charge separation for adequate sensing of an exemplary multi-level FeRAM memory device in which various aspects of the present invention may be carried out. At this median read voltage, it may be observed that the levels of charge separation are greatest from mid to upper write voltages.

Figure 8:
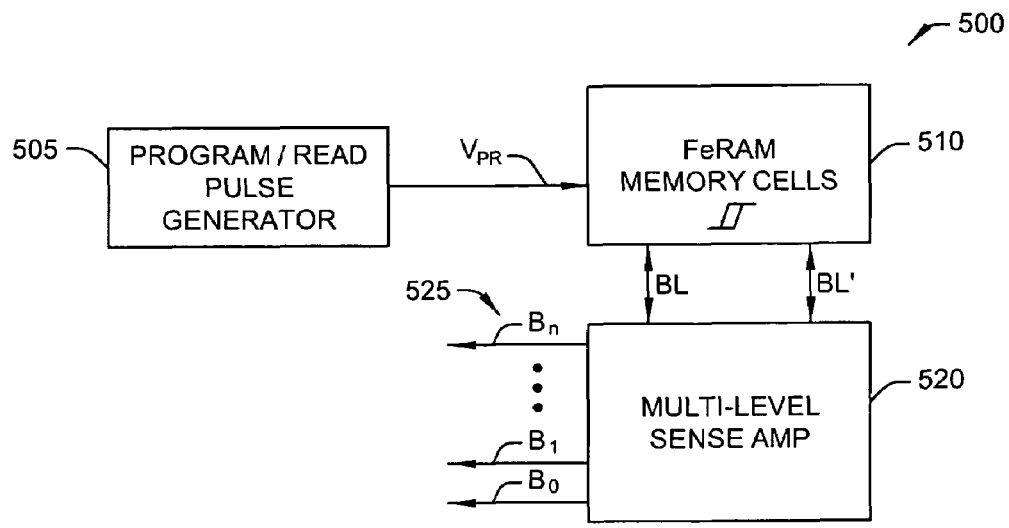
FIG. 8 is a block diagram illustrating an exemplary multi-level FeRAM memory device in which various aspects of the present invention may be carried out.

FIG. 8 illustrates a block diagram of an exemplary multi-level FeRAM memory device 500, in which various aspects of the present invention may be carried out. The exemplary multi-level FeRAM memory device 500 comprises a program and read pulse generator 505 operably coupleable to an FeRAM memory cell 510. The generator 505 is operable to provide a program (write) pulse or a read pulse with voltage $V_{PR}$ to one or more of an array of FeRAM memory cells 510. The generator 505 is further operable during a write operation, to program the memory cell to one of a plurality of data states associated with a switched polarization charge level stored in the memory cell 510, based on one of a plurality of program pulse voltage levels. The FeRAM memory cell 510 is coupleable to a data bit line BL or BL' to receive the program pulse at one of the plurality of program pulse voltage levels and to store one of a plurality of data states associated with a polarization charge level. (Note that the connection of the program voltage to the bit line(s) is not illustrated in FIG. 8 for purposes of clarity, however, such a connection may be employed, as may be desired).

During the write memory operation, the program and read pulse generator 505 couples to the FeRAM memory cell 510 which are coupled to the data bit lines BL and BL'. The program and read pulse generator 505, for example, applies a program pulse (write pulse) to the memory cell with the word line asserted and the plate line grounded, wherein one of a plurality of (e.g., voltage) levels of the program pulse determines the one of a plurality of data states stored in the memory cell in one of a plurality of polarization charge levels.

Optionally, a multi-level sense amp 520 is coupleable to the data bit lines BL and BL', during a read operation, and operable to sense a differential voltage across the data bit lines, wherein the magnitude of the differential voltage corresponds to one of the plurality of data states stored in the FeRAM memory cell 510, wherein one of the plurality of data states 525 may be output from multi-level sense amp 520.

During the read memory operation, the bit lines may be precharged and then allowed to float, after which time the multi-level sense amp 520 is coupled to the data bit lines BL and the BL'. The FeRAM memory cell 510 is coupled to one of the bit lines, and a reference voltage coupled to the other of the bit lines. The program and read pulse generator 505 is coupled to the FeRAM memory cell 510, and applies a read pulse to the plate line of the memory cell with the word line asserted. The sense amp then senses the differential voltage across the bit lines between the reference voltage and a signal produced by the cell based on the level of polarization charge stored in the cell. One of the plurality of data states $B_{0-n}$ 525 may be then determined and output from the multi-level sense amp based on the magnitude of the differential voltage associated with one of the plurality of polarization charge levels stored in the FeRAM memory cell 510.

Figure 9:
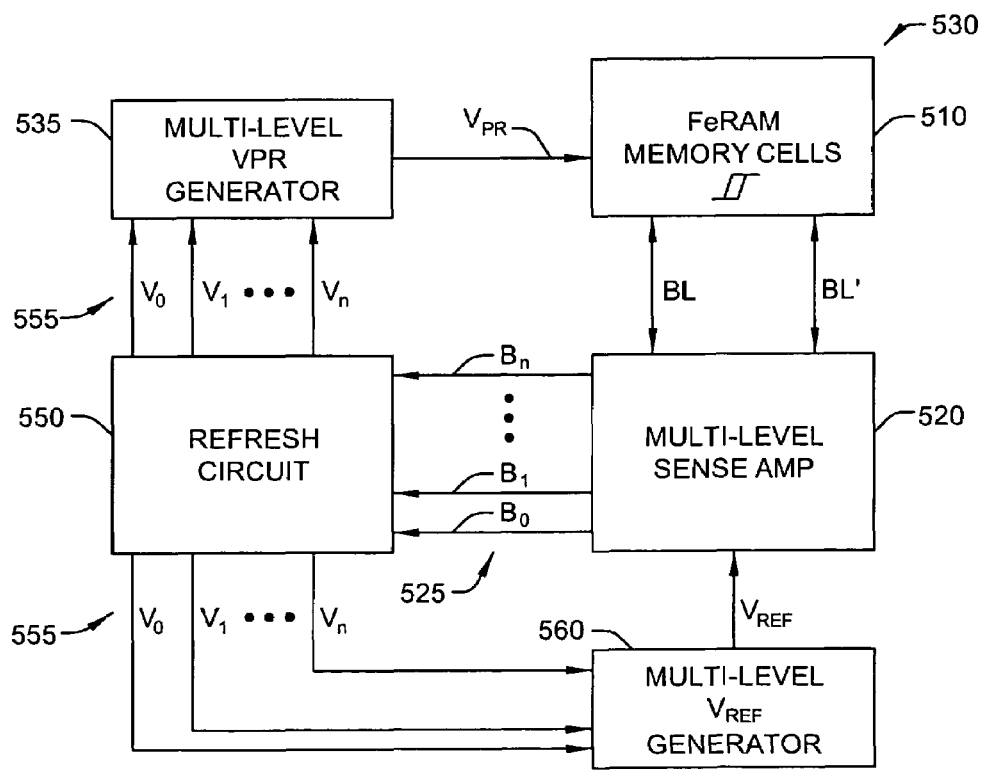
FIG. 9 is a block diagram illustrating an exemplary multi-level FeRAM memory device including a refresh circuit in which various aspects of the present invention may be carried out.

Another option is shown in FIG. 9, a block diagram illustrating an exemplary multi-level FeRAM memory device 530, which further includes a refresh circuit and a multi-level reference generator in accordance with several aspects of the present invention. The exemplary multi-level FeRAM memory device 530 comprises a multi-level program and read pulse generator 535, which is coupleable to the FeRAM memory cell 510 and a refresh circuit 550. The refresh circuit is operable to receive one of the plurality of potential data states 525 from the multi-level sense amp 520 after a read operation, and produce one of a plurality of voltage level control signals 555 and operably couple the voltage level control signal 555 to the multi-level program and read pulse generator 535.

The multi-level program and read pulse generator 535, is then further operable to receive the voltage level control signal 555 from the refresh circuit 550, and to select one of a plurality of voltage levels of the program pulse based on the voltage level control signal. As discussed in FIG. 8, the program pulse of the pulse generator 535 of FIG. 9 may then be used during a write memory operation to program the FeRAM memory cell 510 to the voltage level of the program pulse. Again, the program pulse voltage level determines one of the plurality of data states which may be stored in the memory cell in one of a plurality of polarization charge levels.

The refresh circuit 550, is further operable to initiate a refresh operation comprising a read and re-write operation (restore operation) after a predetermined time period. Thus the refresh circuit 550 of the multi-level FeRAM memory device 530, provides a periodic rewrite of one of the plurality of data states stored in the FeRAM memory cell 510. In addition, since read operations are destructive, the refresh circuit 550 or a circuit similar thereto may be employed to write data back to a cell after a read operation.

As discussed previously a refresh may only be needed when memory operation voltages below the saturation voltage (e.g., about 1.35 volts in the above example) are used in the present invention. For example, if 1.5 V and 2.5 V programming and read voltages were used in the present invention, a refresh may not be required. However, if 0.5 V and 2.5 V voltages were used, as in the example discussed in association with FIG. 7A; then a refresh circuit may be advisable. Although only the data associated with the 0.5 V may actually require the rewrite, one would not know which voltage level was used until the data was first read sensed. In another alternative aspect of the present invention, one or more registers or other management control circuitry may be employed to store cell locations, segments or array portions that are programmed with program voltages which require a refresh. In such an instance, refresh circuitry and resources associated therewith may monitor or access such registers to intelligently refresh only those cells that need refresh. Alternatively, if different cells require refresh at differing refresh time intervals (due to differing, low voltage program pulses) such data may also be employed to selectively refresh various cells according to differing refresh time intervals, as may be desired.

Optionally, FIG. 9 further comprises a multi-level reference generator 560 operable to generate one of a plurality of reference voltages for use by the multi-level sense amp for reading the memory cells. Various levels of reference voltage may be needed in the sense amp to read the memory cells, particularly if the sense amps are of the conventional variety which work advantageously when the reference voltage is mid-way between the sense voltages associated with a "0" and a "1" state of the data. Optionally, the multi-level reference generator 560 is further operable to receive one of the plurality of voltage level control signals 555, whereby a selection of the best level of reference voltage may be made for generation. Alternatively, the reference voltage(s) may be preselected based upon the expected charge levels for the various data states.

Figure 10:
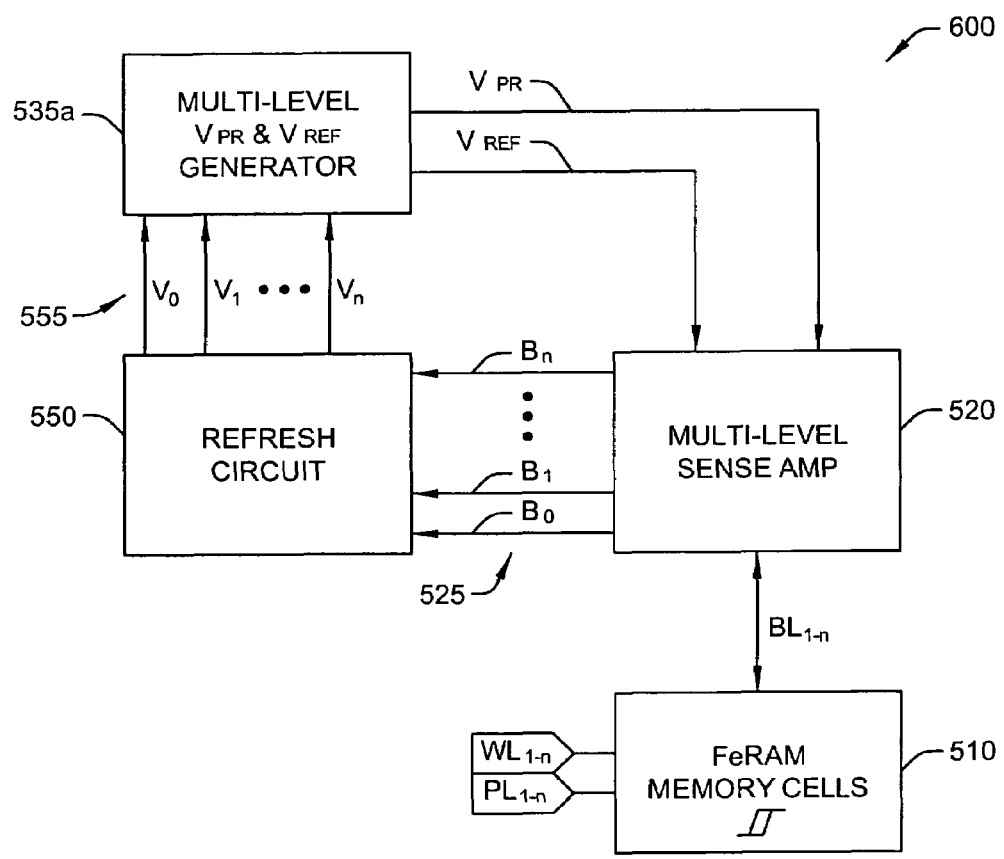
FIG. 10 is a block diagram illustrating an exemplary multi-level FeRAM memory device including a refresh circuit, and a multi-level combined programming voltage and reference voltage generator in which various aspects of the present invention may be carried out.

FIG. 10 illustrates another block diagram of an optional exemplary multi-level FeRAM memory device 600 in accordance with various aspects of the present invention. The multi-level memory device 600 comprises a generator circuit 535a, wherein the multi-level program and read pulse generator circuit 535 of FIG. 9 is combined with the multi-level reference voltage generator 560 of FIG. 9, the refresh circuit 550, and the FeRAM memory cell 510 of FIGS. 8 & 9. Some of the functions have been combined, but otherwise generally operates the same as described with FIGS. 8 & 9.

Figure 11:
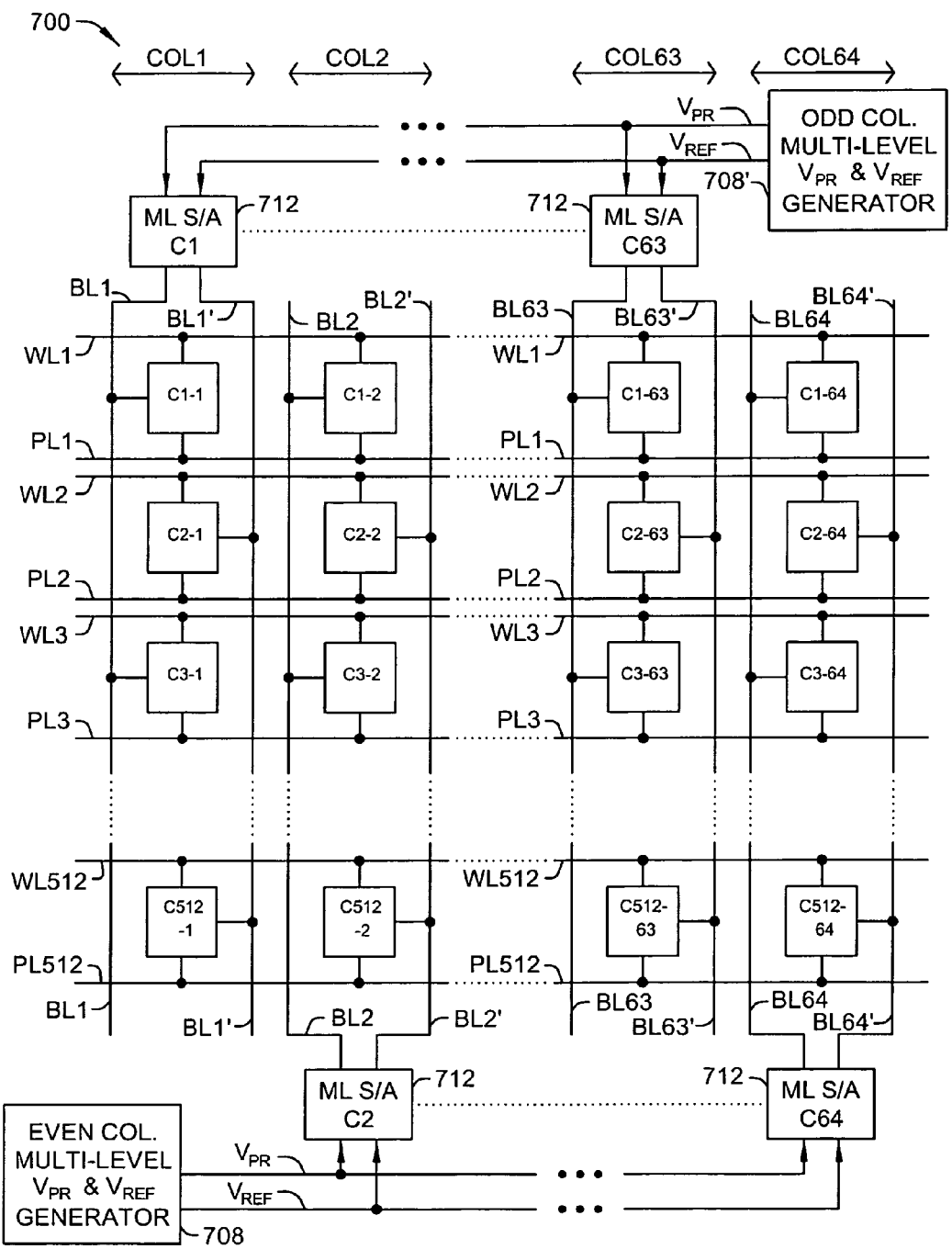
FIG. 11 is a schematic diagram illustrating a segment portion of an exemplary multi-level FeRAM memory device similar to that of FIG. 9.

FIG. 11 is a schematic diagram illustrating a segment portion of an exemplary multi-level FeRAM memory device 700 similar to that of FIG. 9. Memory device portion 700 has 512 rows (words) and 64 columns (bits) of data storage cells $C_{ROW-COLUMN}$ configured in a folded bit line architecture, where each column of cells is accessed via a pair of complimentary bit lines $BL_{COLUMN}$ and $BL_{COLUMN}'$. Later, more detailed exemplary portions of one column of the device 700 will be described and illustrated in FIGS. 17–19. FIG. 11 further illustrates how the cells of C1-1 through C1-64 form a data word accessible via a word line WL1 and complimentary bit line pairs BL1/BL1' through BL64/BL64', where cell data is sensed during data read operations using multi-level sense amp circuits ML S/A C1, through ML S/A C64 (712) associated with columns 1 through 64, respectively.

In a typical folded bit line architecture ferroelectric memory device, the cells $C_{ROW-COLUMN}$ individually include one or more ferroelectric cell capacitors and one or more access transistors to connect the cell capacitors between one of the complimentary bit lines associated with the cell column and a plate line, where the other bit line is connected to a reference voltage. Note that although a folded-bit architecture is illustrated and briefly described to appreciate one exemplary context in which multi-bit FeRAM systems may be employed, other architectures alternatively may be employed and are contemplated as falling within the scope of the present invention.

In the device 700, the multi-level sense amps associated with even numbered columns are located at the bottom of the segment, whereas multi-level sense amps ML S/A C1-64 (712) associated with odd numbered columns are located at the top of the segment. In order to reduce the number of components in the exemplary device 700, as well as to increase device density therein, individual multi-level program and read pulse generators and reference voltage generators are not provided for each complimentary bit line pair. Rather, shared multi-level program and read pulse generators and reference voltage generators are provided in the present example at the top and bottom of the segment columns. An even column program/read and reference generator 708 is provided at the bottom of the segment columns to service the sense amps associated with even numbered columns and an odd column program/read and reference generator 708' is provided at the top of the segment columns to service the sense amps associated with odd numbered columns. The program and reference voltages from the generators 708, 708' may be coupled to one of the bit lines in the columns using one of a pair of bit line select switches within the multi-level sense amps ML S/A C1-64 (712), depending upon whether an odd (associated with odd-numbered word lines) or even numbered (associated with even numbered word lines) target data word is being read.

Sharing the program/read and reference generators 708, 708' across multiple data columns, however, requires the connection of reference bit lines from all the odd numbered columns to one another, and the connection of reference bit lines from all the even numbered data columns together through the activated connection switches within the multi-level sense amps ML S/A C1-64 (712). In a standard ferroelectric memory read sequence, the complimentary bit lines are precharged or equalized to ground and then left floating. Then, sense bit lines (e.g., the ones of the complimentary bit lines associated with the cell to be accessed) are connected to the target data cells of interest and the cells are interrogated. The program/read and reference generators 708, 708' are then connected to the reference bit lines (the others of the complimentary bit line pairs), so as to establish a differential voltage at the sense amp terminals.

In reading the first data word of the illustrated segment along word line WL1 in the device 700, the cells C1-1 through C1-64 are connected to the sense bit lines BL1, BL2 . . . , BL63, and BL64 while the complimentary reference bit lines BL1', BL2' . . . , BL63', and BL64' are floating. When the reference bit lines BL1', BL2' . . . BL63', and BL64' are thereafter connected to the program/read and reference generators 708, 708' (with odd column reference bit lines BL1', BL3' . . . , and BL63' connected to one another and even column reference bit lines BL2', BL4' . . . , and BL64' connected to one another), the reference voltage thereon is $V_{REF}$, on the connected reference bit lines.

The device 700 consists of a data cell column of 512 1T1C ferroelectric memory cells. Cells comprising FE capacitors and MOS access transistors are configured in the column along a pair of complimentary bit lines BL1 and BL1'. The cells C1-1 through C1-64 and the contents thereof are accessed during read, restore, and write operations via the bit lines BL1 and BL1' using word line and plate line signals WL1–WL512 and PL1–PL512, respectively. Typically in FERAM, adjacent plate lines in a group are shorted together to reduce the number of plate line drivers. For example, the plate lines PL1–PL32 could be shorted together and driven by only one driver. In this example, 512 plate lines would require only 16 plate line drivers. For a cell to be interrogated both plate and word lines are ON. Since only one word line is turned ON at a given time, the cell to be interrogated is uniquely defined.

A reference voltage $V_{REF}$ is applied to the other data cell column bit line from a shared program/read and reference generator 708. As discussed above, the generator is shared among a number of data cell columns. That is, the reference generator is common to all the columns attached to a reference generator.

In the following exemplary descriptions, certain ones of the data bit lines BL1/BL1' are variously referred to as "sense bit line" and "reference bit line". These terms are used herein to indicate the read operation specific association of certain bit lines with either the memory cell being sensed or the program/read and reference voltage generator 708, depending upon which cell is being sensed. During a particular read operation, one of the bit lines is destined for connection with the reference voltage $V_{REF}$ and is referred to herein as a reference bit line with respect to the read operation. The other bit line is coupled with the sensed cell during portions of the read operation, and is referred to as a sense bit line. It will be appreciated in this regard, that the same bit line may be the reference bit line during one read operation and the sense bit line in another read operation, depending upon which cell is being accessed in the column.

During read operations, bit lines BL1 and BL1' are initially precharged to Vss or ground, and then floated. Then, sense bit lines (e.g., the ones of the complimentary bit lines associated with the cells to be accessed) are connected to the target data cells of interest. For example, when the first cell C1-1 is to be read, the bit lines BL1 are sense bit lines, and the complimentary bit lines BL1' are reference bit lines. Conversely, when the second cell C2-1 is to be read, the bit lines BL1' are sense bit lines, and the complimentary bit lines BL1 are reference bit lines.

The invention provides methods and apparatus which may be employed to write, read and restore multiple bits of data within a single FeRAM memory cell, wherein one of a plurality of polarization charge levels may be stored in the cell, each polarization charge level being associated with one of a plurality of data states.

Although 505 of FIG. 8 is illustrated and described as a multi-level pulse generator, while 535 of FIG. 9 and 535a of FIG. 10 are illustrated and described as voltage generators, the pulse generator 505 of FIG. 8 may be used simply as a multi-level voltage generator, and the voltage generators 535 and 535a of FIG. 9 and FIG. 10, respectively, may be operable as multi-level pulse generators.

FIGS. 12–19 illustrate various exemplary supporting circuits of a multi-level ferroelectric memory device in accordance with the invention. Although illustrated and described hereinafter as part of the multi-level ferroelectric memory device, the various circuit portions or other supporting circuitry in accordance with the invention may be separate circuits and may be employed in association with other multi-level FeRAM circuits apart from the exemplary circuits illustrated and described herein. In addition, it will be appreciated that the various aspects of the invention may be employed in association with memory devices of different sizes and configurations than the exemplary multi-level ferroelectric memory device illustrated and described herein.

Figure 12:
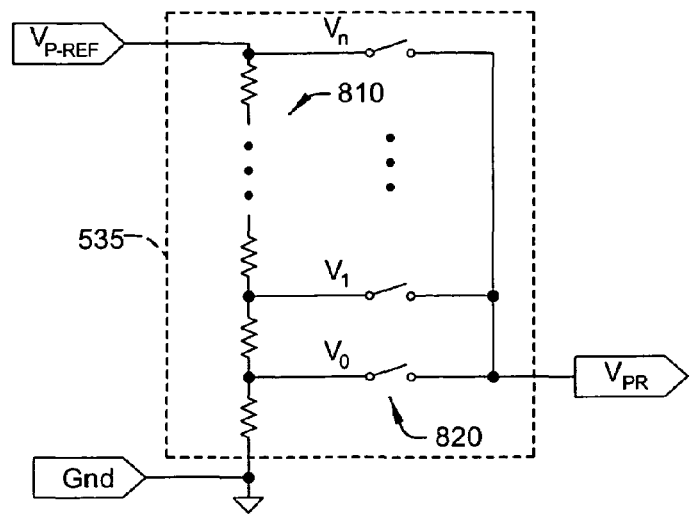
FIG. 12 is a schematic diagram illustrating a multi-level program and read voltage generator of the exemplary multi-level FeRAM memory device of FIGS. 8–9.

FIG. 12 illustrates a simplified schematic diagram of an exemplary multi-level program and read pulse generator 505 or 535 of the multi-level FeRAM memory devices of FIGS. 8 and 9, respectively. A program reference voltage level applied at $V_{P\text{-}REF}$ relative to ground Gnd may be subdivided through the multi-stage voltage divider 810 of 535 to produce a pulse with an output voltage $V_{PR}$ based on the selection of one of a plurality of voltage levels $V_0$–$V_n$ 820 from the voltage divider 810. The pulse generator 505, 535 is operable to select one of a plurality of voltage level selection switches 820 at each stage of the divider, and hold the voltage level selection for a time, which will produce a sufficient pulsewidth for programming or reading an FeRAM memory cell in accordance with the present invention.

The pulse output $V_{PR}$ of the generator 505, 535 may be used to program an FeRAM memory cell by applying the pulse to the cell during the write operation, either directly via the bit line associated with the cell, or indirectly using one of a pair of bit line select switches, which may be used separately, or included within the multi-level sense amps.

The pulse output $V_{PR}$ of the generator 505, 535 may also be used to initiate a read of an FeRAM memory cell by applying the pulse to the plate line of the cell during the read operation.

Alternatively, the exemplary multi-level program and read pulse generator 535 of the multi-level FeRAM memory device, may simply be used to produce a multi-level voltage, wherein the timing for pulse generation in association with a write or read memory operation is done in a subsequent circuit, such as the odd/even bit line selection switching circuits which will be discussed later in connection with FIGS. 17–19.

Figures 13, 14:
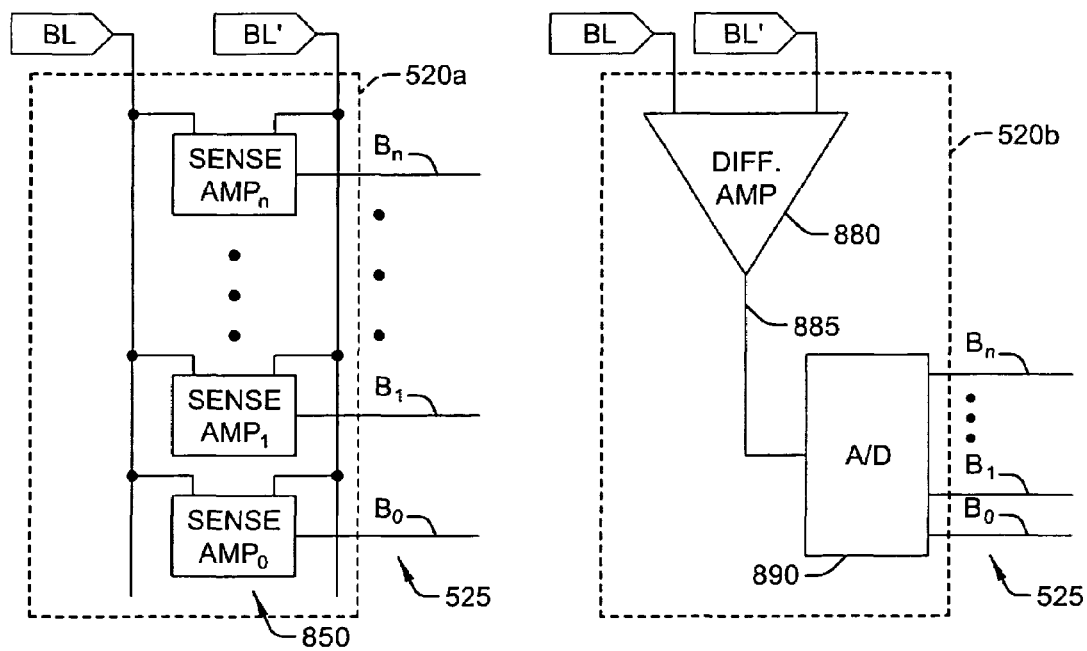
FIG. 13 is a schematic diagram illustrating a multi-level sense amp of the exemplary multi-level FeRAM memory device of FIGS. 8–10.
FIG. 14 is a schematic diagram illustrating another multi-level sense amp of the exemplary multi-level FeRAM memory device of FIGS. 8–10.

FIG. 13 illustrates a schematic diagram of an exemplary multi-level sense amp 520a of the multi-level FeRAM memory device of FIGS. 8–10 & 11. Multi-level sense amp 520a, is operable to couple via bit lines BL and BL' to the FeRAM memory cells 510 during a read operation, and to sense a data state of the cell associated with one of a plurality of polarization charge levels stored in the cell. In this particular example, the multi-level sense amp 520a is comprised of a plurality of sense amps 850, each operable to sense a specific polarization charge level and determine one of the plurality of data states 525 associated thereto. Each of the sense amps 850 of the multi-level sense amp 520a forms one data state of the plurality of data states $B_{0\text{-}n}$ 525.

Unlike conventional sense amps, however, the plurality of sense amps 850 may require an additional input buffer stage to isolate each sense amp from loading the bit lines, to prevent the latching action of one sense amp from affecting the sensing in all the other sense amps.

For example, as discussed earlier during the read memory operation, after floating, the multi-level sense amp 520a is coupled to the data bit lines BL and BL'. The FeRAM memory cell 510 is then coupled to one of the bit lines, and a reference voltage is coupled to the other of the bit lines. The multi-level program and read pulse generator (e.g., 535 of FIG. 9) is coupled to the FeRAM memory cell 510, and applies a read pulse to the plate line of the memory cell with the word line asserted. The multi-level sense amp 520a then senses the differential voltage across the bit lines between the reference voltage and a signal produced by the cell based on the level of polarization charge stored in the cell. One of the plurality of data states 525 may be determined and output from one of the sense amps 850 of the multi-level sense amp 520a, based on the magnitude of the differential voltage associated with one of the plurality of polarization charge levels stored in the FeRAM memory cell 510.

FIG. 14 is a schematic diagram illustrating another exemplary multi-level sense amp 520b of the exemplary multi-level FeRAM memory device of FIGS. 8–10. Multi-level sense amp 520b, is operable to couple via bit lines BL and BL' to the FeRAM memory cells 510 during a read operation, and to sense a data state of the cell associated with one of a plurality of polarization charge levels stored in the cell. In this example, the multi-level sense amp 520b is comprised of a differential amplifier 880, operable to sense the voltage difference between the cell polarization charge voltage on one bit line and the reference voltage on the other bit line, and outputs the differential voltage 885 to an analog to digital converter 890 which is operable to determine a plurality of data states $B_{0\text{-}n}$ 525 which are associated with one of a plurality of polarization charge levels. Assuming the usual read conditions, the FeRAM memory cell is asserted by the word line and polled by the read pulse to produce a charge voltage on an associated bit line, while a reference voltage is applied to the other bit line.

Alternatively, a buffer amplifier coupled to the bit line associated with the memory cell may replace the differential amplifier 880, while the A/D converter 890 supplies an internal reference voltage.

Figure 15:
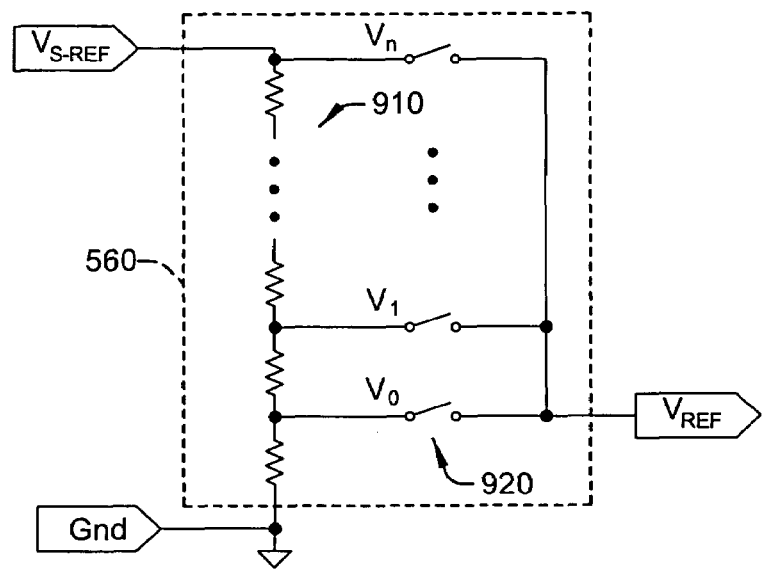
FIG. 15 is a schematic diagram illustrating a multi-level reference voltage generator of the exemplary multi-level FeRAM memory device of FIG. 9.

FIG. 15 illustrates a simplified schematic diagram of an exemplary multi-level reference voltage generator 560 of the multi-level FeRAM memory device of FIG. 9. A sense reference voltage level is applied at $V_{S-REF}$ relative to ground Gnd, is subdivided through the multi-stage voltage divider 910 of 560 to produce a reference voltage with one of a plurality of voltage levels $V_0$–$V_n$, output at $V_{REF}$. The reference generator 560 is operable to select one of a plurality of voltage level selection switches 920 at each stage of the divider, and hold the voltage level selection for reading an FeRAM memory cell in accordance with the present invention.

The reference voltage output $V_{REF}$ of the generator 560 may be used to sense the state of an FeRAM memory cell by applying the voltage as a multi-level reference voltage to the cell during the read operation. The reference may be applied either directly to the reference bit line (the bit line compliment of that associated with the cell), or indirectly using one of a pair of bit line select switches. As with the program and read pulse generator, these switches may be used separately, or included within the multi-level sense amps.

Figure 16:
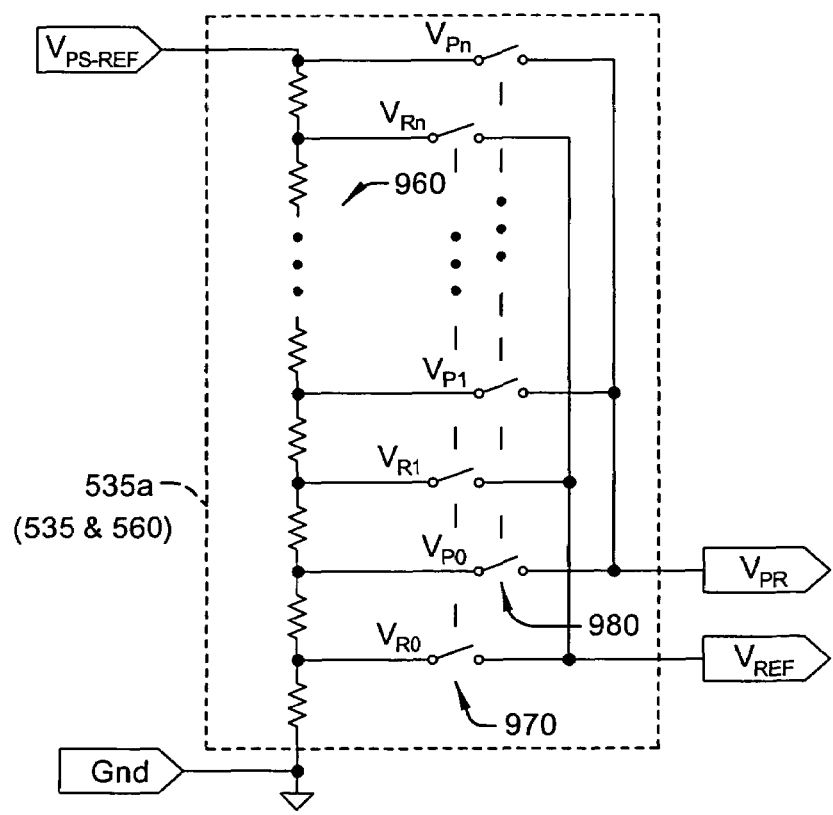
FIG. 16 is a schematic diagram illustrating a multi-level combined programming voltage and reference voltage generator of the exemplary multi-level FeRAM memory device of FIG. 10.

FIG. 16 illustrates a schematic diagram of an exemplary multi-level program and reference voltage generator 535a of the exemplary multi-level FeRAM memory device of FIGS. 10 and 11. Generator 535a combines the program and read voltage generator of FIG. 12, and the reference voltage generator of FIG. 15, but may use a common voltage divider 960. A program and sense reference voltage level applied at $V_{PS-REF}$ relative to ground Gnd, may be subdivided through the multi-stage voltage divider 960 of 535a to produce a program or read pulse with one of a plurality of voltage levels $V_{P0}$–$V_{Pn}$, output at $V_{PR}$, and to produce a reference voltage with one of a plurality of voltage levels $V_{R0}$–$V_{Rn}$, output at $V_{REF}$. The generator 535a is operable to select one of a plurality of program/read voltage level selection switches 970 and reference voltage level selection switches 980 at each stage of the divider, and hold the voltage level selections for a time, which will produce a sufficient pulse-width for programming or reading an FeRAM memory cell in accordance with the present invention. All functions and operations are the same as discussed previously, and therefore need not be described again.

Figure 17:
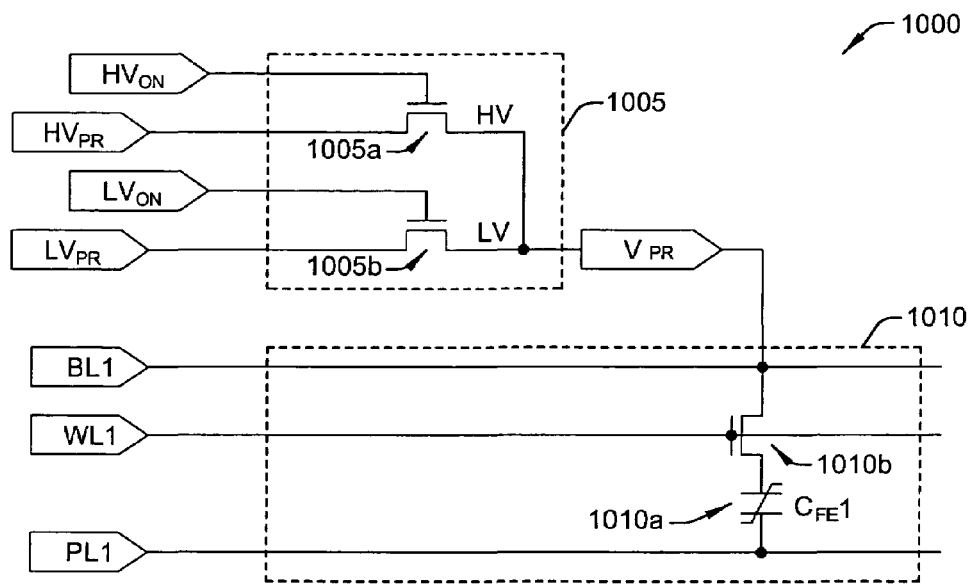
FIG. 17 is a schematic diagram illustrating an exemplary circuit for coupling two levels of a program pulse to an FeRAM memory cell in a one bit multi-level FeRAM memory device in accordance with the present invention.

FIG. 17 illustrates a schematic diagram of an exemplary multi-level FeRAM memory device 1000, using an exemplary two level program and read pulse generator 1005 coupled to an FeRAM memory cell 1010, in accordance with the present invention. The program and read pulse generator 1005 comprises two transistors 1005a and 1005b. Low voltage transistor 1005a is fed by a low voltage program/read voltage $LV_{PR}$ and is gated by $LV_{ON}$, and high voltage transistor 1005b is fed by a high voltage program/read voltage $HV_{PR}$ and is gated by $HV_{ON}$ to provide a program/read voltage pulse output $V_{PR}$. FeRAM memory cell 1010 comprises an FeCap 1010a with capacitance $C_{FE}1$, which may be coupled to associated bit line BL1 by access transistor 1010b when word line WL1 is asserted. Plate line PL1 may be grounded during a write memory operation, or a read pulse from $V_{PR}$ may be applied to the plate line PL1 during a read memory operation.

As shown, FIG. 17 may be used to demonstrate optionally programming the memory cell for one-bit multi-level storage, or for 2 bits of multi-level storage (however, in a single polarization in this example). For example:

1.) For 2 bit storage, we may assign a "0" and a "1" data state for each of the LV and HV voltage levels in the one polarization direction to yield 2 data states, with a modified circuit or supplemental circuit, such LV and HV levels can be written to the cell in the opposite direction to provide 4 data states, as previously discussed.

2.) For 1 bit storage, we may assign a "0" data state to the LV voltage level, and a "1" data state to the HV voltage level yielding 2 data states. Alternatively, only one of the LV and HV levels are employed in programming, and are applied in different biasing directions to provide 2 binary states.

It should be understood that in FIG. 17, that the plate line PL1 in conventional ferroelectric memory cells typically pulses from low to high. In the present invention, the plate line may similarly pulse from low to high, or from low to another voltage level associated with the program data level, or alternatively may be kept at an intermediate level (e.g., a reference VDD/2), as may be appreciated. In the following manner, the differing program voltage levels may be employed in conjunction with the plate line to program the ferroelectric memory cell to a plurality of polarization charge density levels in one polarization direction, as well as to a plurality of polarization charge density levels in the opposite polarization direction.

Figure 18:
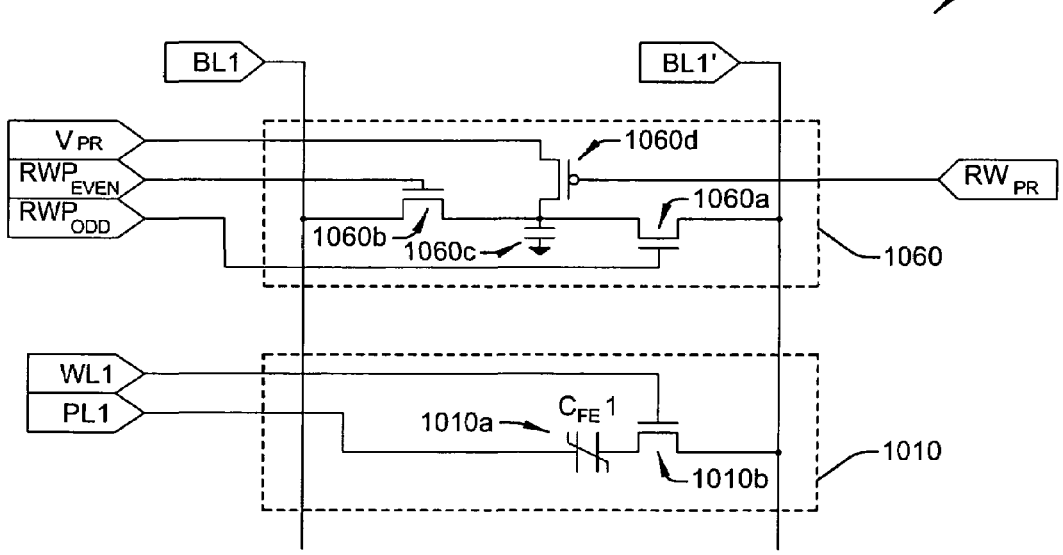
FIG. 18 is a schematic diagram illustrating an exemplary coupling circuit portion, for coupling multiple levels of a program voltage via odd and even bit lines to an FeRAM memory cell of a multi-level FeRAM memory device in accordance with the present invention.

FIG. 18 is a schematic diagram of an exemplary coupling circuit portion 1050 of the multi-level FeRAM memory device, for coupling multiple levels of a program voltage via odd and even bit lines to an FeRAM memory cell. The coupling circuit portion 1050 comprises a bit line select circuit 1060, and the memory cell 1010, both mentioned previously. The program/read and reference generator output (e.g., 708/708' of FIG. 11, 535 of FIG. 12, 535 of FIG. 16, and 1005 of FIG. 17), is input to the bit line select circuit 1060 at $V_{PR}$. One of a pair of bit line select switches may then be selected to couple the $V_{PR}$ input to an odd or even bit line BL1 and BL1' associated with the memory cell.

In the present example, odd numbered memory cells C1-1, C3-1 . . . C511-1 are associated with odd numbered rows WL1, WL3 . . . WL511 and even numbered memory cells C2-1, C4-1 . . . C512-1 associated with even numbered rows WL2, WL4 . . . WL512. The program and read voltage $V_{PR}$ is applied to the memory cell column bit line from the shared program/read and reference generator (e.g., 708/708' of FIG. 11) using a transistor 1060a or 1060b via row word line program signals $RWP_{ODD}$ or $RWP_{EVEN}$ and an optional program capacitor 1060c, which may be precharged to one of the plurality of program voltages using a transistor 1060d according to a program cell gate signal $RW_{PR}$. As discussed above, the program/read and reference generator 708 is shared among a number of data cell columns. That is, the program capacitor 1060c and transistor 1060d are common to all the columns attached to a program/read and reference generator. However, the transistors 1060a and 1060b are unique to each column.

The program and reference voltages from the generators (708, 708' of FIG. 11) may be coupled to one of the bit lines in the columns using one of a pair of bit line select switches, depending upon whether an odd or even numbered target data word is being read. Although the pair of bit line select switches of the bit line select circuit 1060 of FIG. 18 is shown as a separate circuit, alternately the select circuits may reside within the multi-level sense amps (ML S/A C1-64, 712 of FIG. 11).

Figure 19:
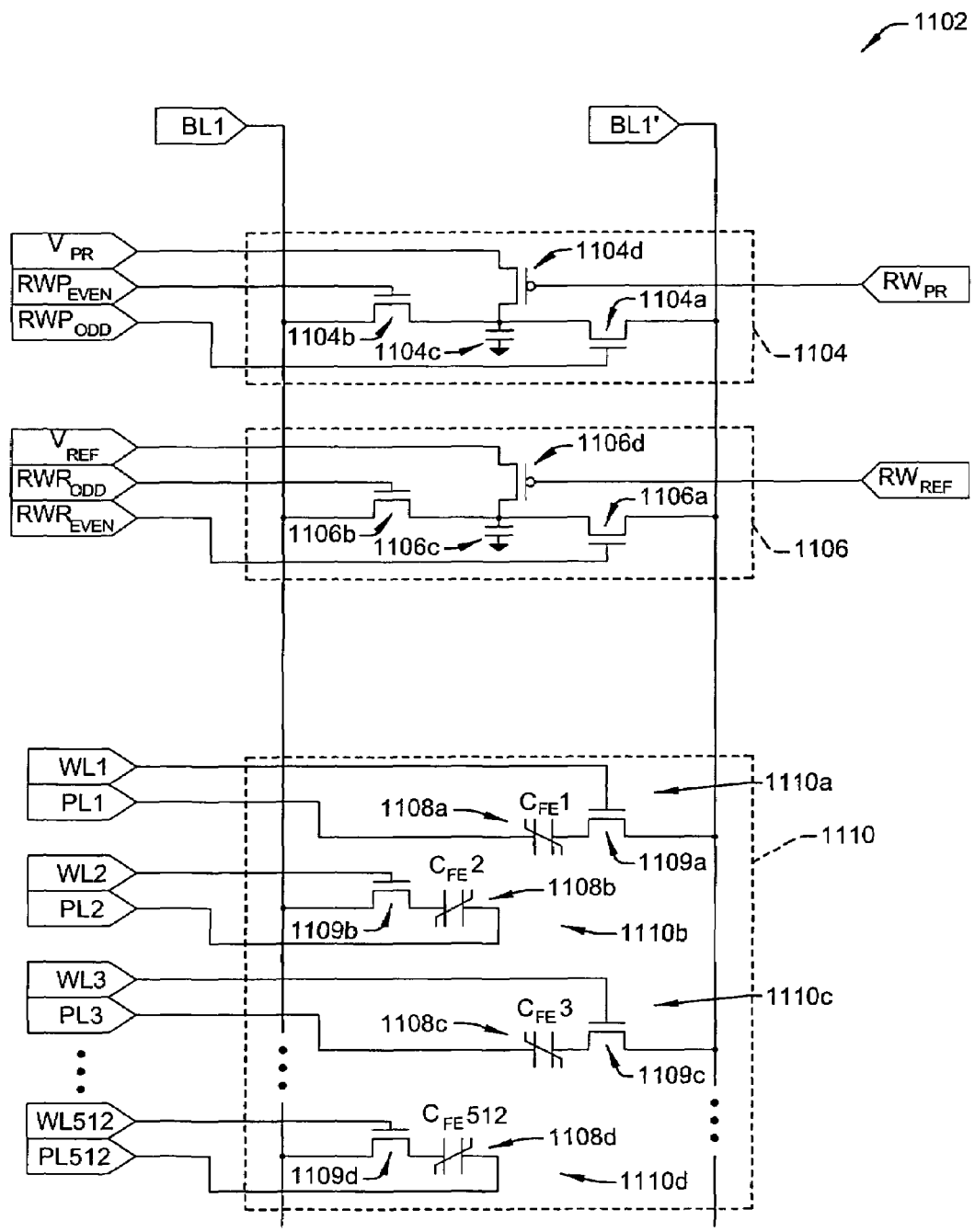
FIG. 19 is a schematic diagram illustrating another exemplary circuit for coupling multiple levels of a program voltage and a reference voltage via odd and even bit lines to an array of FeRAM memory cells in a multi-level FeRAM memory device in accordance with the present invention.

FIG. 19 is a schematic diagram of another exemplary multi-level FeRAM memory device circuit portion 1102, illustrating a means of coupling multiple levels of a program voltage and a reference voltage via odd and even bit lines to an FeRAM memory cell and to a sense amp, respectively. The circuit portion 1102 comprises a program voltage bit line select circuit 1104 (similar to 1060 of FIG. 18), a reference voltage bit line select circuit 1106, and an array of memory cells 1110, each similar to the cell discussed previously.

The program voltage $V_{PR}$ is applied to the program voltage bit line select circuit 1104 and to the memory cell column bit line from the shared program/read and reference generator as previously discussed, using a transistor 1104a or 1104b via row word line program signals $RWP_{ODD}$ or $RWP_{EVEN}$ and an optional program capacitor 1104c, which may be precharged to one of the plurality of program voltages using a transistor 1104d according to a program cell gate signal $RW_{PR}$. Thus, the program voltage coupled to the memory cell for a write memory operation may be one of a plurality of program voltage levels.

The reference voltage $V_{REF}$ is applied to the reference voltage bit line select circuit 1106 and to the other of the memory cell column bit lines from the shared program/read and reference generator as previously discussed, using a transistor 1106a or 1106b via row word line reference signals $RWR_{ODD}$ or $RWR_{EVEN}$ and an optional reference capacitor 1106c, which may be precharged to one of the plurality of reference voltages using a transistor 1106d according to a reference cell gate signal $RW_{REF}$.

Thus the program and reference voltages from the generators (708, 708' of FIG. 11) may be coupled to one of the bit lines in the columns using one of a pair of bit line select switches, depending upon whether an odd or even numbered target data word is being read. Although the pairs of bit line select switches of the bit line select circuits 1104 and 1106 of FIG. 19 are shown as separate circuits, alternately the select circuits may reside within the multi-level sense amps (ML S/A C1-64, 712 of FIG. 11).

The device circuit portion 1102 consists of a data cell column of 512 1T1C ferroelectric memory cells, four of which 1110a–d are illustrated in 1110 of FIG. 19. FeCaps ($C_{FE}1$–$C_{FE}512$) 1108a–d and MOS access transistors 1109a–d are configured in the column along a pair of complimentary bit lines BL1 and BL1'. The cells 1110a–d and the contents thereof are accessed during read, restore, and write operations via the bit lines BL1 and BL1' using word line and plate line signals WL1–WL512 and PL1–PL512, respectively. Typically in FeRAM, adjacent plate lines in a group are shorted together to reduce the number of plate line drivers. For example, the plate lines PL1=PL32 could be shorted together and driven by only one driver. In this example, 512 plate lines would require only 16 plate line drivers. For a cell to be interrogated, both plate and word lines are ON. Since only one word line is turned ON at a given time, the cell to be interrogated is uniquely defined. The FeCaps in odd numbered data words, such as $C_{FE}1$ and $C_{FE}3$ may be connected to the bit line BL1 via WL1 and PL1 or WL3 and PL3, respectively, and FE capacitors $C_{FE}2$ or $C_{FE}512$ in even numbered data words may be connected to the bit line BL1' via WL2 and PL2 or WL512 and PL512, respectively.

During read operations, bit lines BL1 and BL1' and the sense amp bit lines are initially precharged to VSS or ground, and then floated. Then, sense bit lines (e.g., the ones of the complimentary bit lines associated with the cells to be accessed) are connected to the target data cells of interest. For example, when the first cell 1110a is to be read, the bit lines BL1'/ML SABL' are sense bit lines, and the compli-mentary bit lines BL1/ML SABL are reference bit lines and coupled to the reference voltage $V_{REF}$ via transistor 1106b asserted by gate signal $RWR_{ODD}$, wherein the reference voltage may be one of a plurality of reference voltage levels.

In this manner, the invention may be advantageously employed to write, read and restore multiple bits of data in a single memory cell of an FeRAM memory device such as those of FIGS. 8–11. Thus, in FIGS. 8–11, any implementation which stores one of a plurality of data states in one of a plurality of polarization charge levels in a Ferroelectric memory cell during any portion of write or restore memory operation, or senses one of a plurality of data states associated with one of a plurality of polarization charge levels during any portion of a read or restore memory operation is contemplated as falling within the scope of the present invention and the appended claims. Moreover, the invention contemplates writing one of a plurality of program voltages to the memory cell to affect a polarization charge level within the cell any time after the memory cell is coupled with the multi-level program/read voltage generator and to sense the state of the cell any time after the memory cell is coupled to the multi-level sense amp.

In the following, several other aspects of the present invention will each provide a methodology of writing to and reading from an FeRAM memory cell of a multi-level FeRAM memory device, employing one of a plurality of polarization charge levels, and one of a plurality of voltage levels for use as a program voltage during a write memory operation and a read voltage during a read memory operation of such devices illustrated and described herein, as well as other such devices.

Figure 20A:
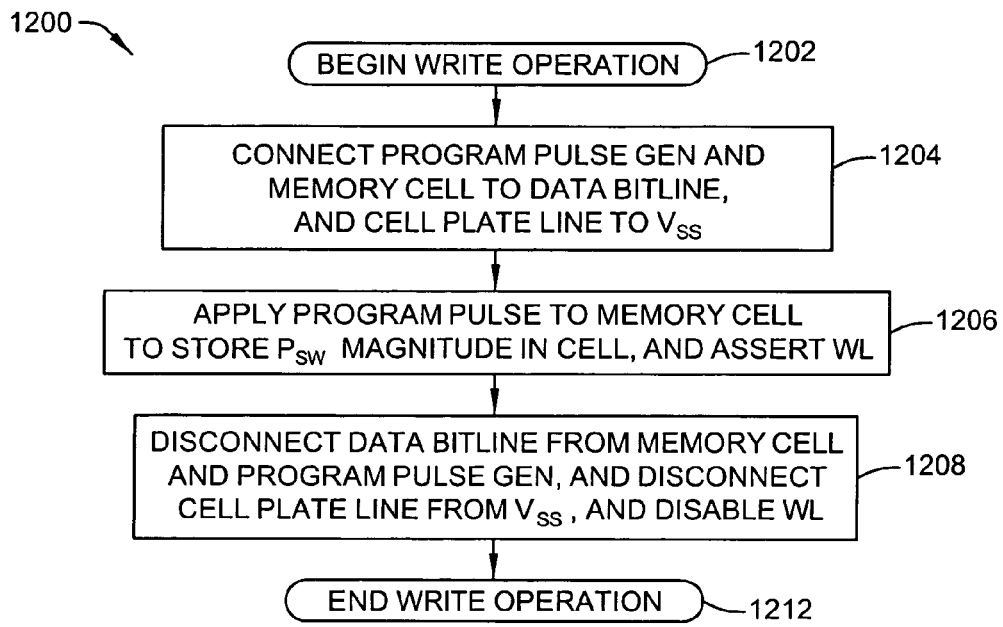
FIG. 20A is a flow diagram illustrating an exemplary method of writing multi-level data to a ferroelectric memory cell in accordance with an aspect of the invention.

Referring now to FIG. 20A, one aspect of the invention provides a method 1200 of writing multiple levels of data to a ferroelectric memory cell of a multi-level FeRAM memory device during memory write operations. Although the methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the operation of memory devices illustrated and described herein as well as in association with other structures not illustrated.

Beginning at 1202, the exemplary method 1200 comprises coupling a program voltage to the ferroelectric memory cell to be programmed (e.g., via a data bit line) at 1204. Concurrently or thereafter, $V_{SS}$ or another predetermined potential is applied to the plate line of the cell, resulting in a charging of the memory cell to one of a plurality of polarization charge levels at 1206, wherein the charge level is a function of a magnitude of the voltage pulse. This can be accomplished, for example, while asserting the word line of the memory cell. Thereafter the data bit line may be decoupled from the memory cell as well as the cell plate line and the word line at 1208.

Figure 20B:
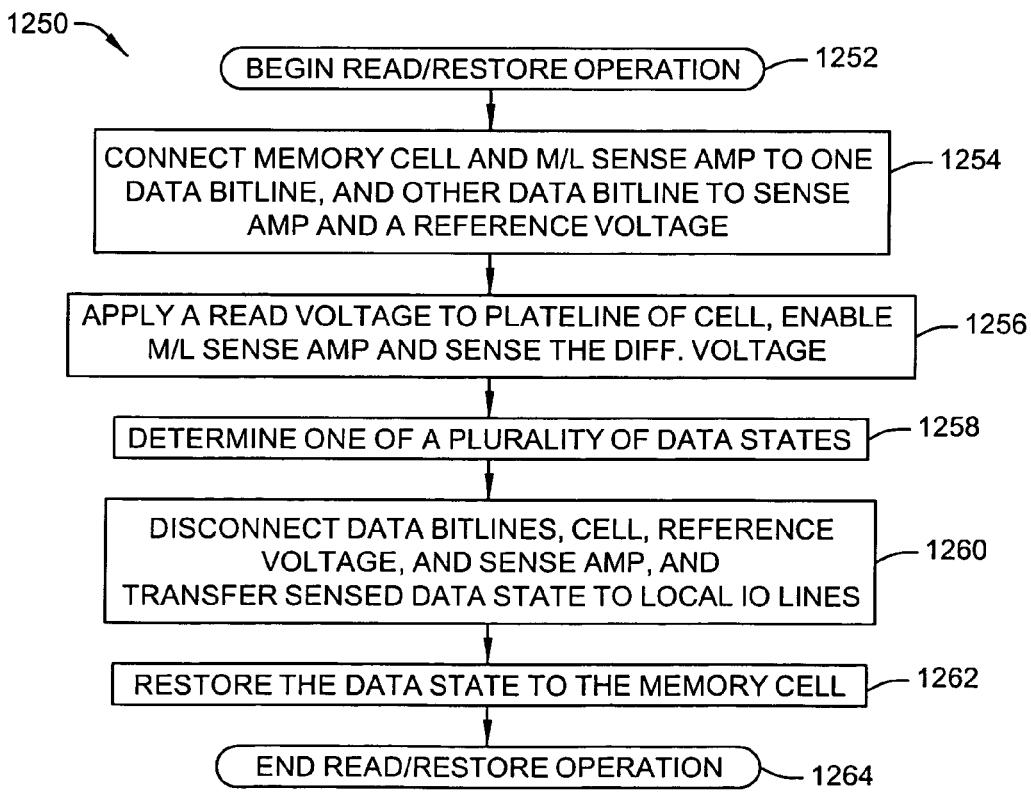
FIG. 20B is a flow diagram illustrating an exemplary method of reading multi-level data from a ferroelectric memory cell and restoring the sensed multi-level data to the FeRAM memory cell in accordance with another aspect of the invention.

FIG. 20B illustrates another exemplary aspect of the invention providing a method 1250 of operating ferroelectric memory devices during read operations. Beginning at 1252, the exemplary method 1250 comprises coupling a first data bit line to the ferroelectric memory cell and an input of a multi-level sense amp at 1254. Act 1254 further comprises coupling a second data bit line to a reference voltage and the other input of the multi-level sense amp. A read voltage is then applied to the plate line of the memory cell at 1256 while asserting the word line of the memory cell.

The multilevel sense amp is enabled, and one of a plurality of polarization charge levels is sensed with the multi-level sense amp produced by the differential voltage between the data bit line inputs. Using the difference, the data state is determined at 1258. Subsequently, the data bit lines may be decoupled, along with the memory cell, reference voltage, and sense amp at 1260. Act 1260 further comprises transferring the data state that was determined to local IO lines, and thereafter restoring the original one of a plurality of data states to the sensed memory cell at 1262.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of reading data associated with a programmed multi-bit ferroelectric memory device, comprising:

ascertaining a voltage associated with a polarization charge density of the programmed multi-bit ferroelectric memory device, comprising:

coupling a multi-level sense amplifier circuit to first and second bit lines associated with a ferroelectric memory cell of the memory device;

coupling the ferroelectric memory cell to the first bit line and a reference voltage to the second bit line;

sensing a voltage associated with a polarization charge density of the ferroelectric memory cell and the reference voltage with the multi-level sense amplifier circuit; and applying a read voltage to a plate line of the ferroelectric memory cell; and determining a state of the programmed multi-bit ferroelectric memory device based on a magnitude of a difference between the voltage associated with the polarization charge density and a reference voltage.

2. A method of reading data associated with a programmed multi-bit ferroelectric memory device, comprising:

ascertaining a voltage associated with a polarization charge density of the programmed multi-bit ferroelectric memory device, comprising:

coupling a multi-level sense amplifier circuit to first and second bit lines associated with a ferroelectric memory cell of the memory device;

coupling the ferroelectric memory cell to the first bit line and a reference voltage to the second bit line; and sensing a voltage associated with a polarization charge density of the ferroelectric memory cell and the reference voltage with the multi-level sense amplifier circuit;

inputting the state to a refresh circuit based on a predetermined time interval from a previous refresh operation; and restoring the state to the sensed ferroelectric memory cell.

3. The method of claim 1, wherein determining the state further comprises determining the state based on a polarity of the magnitude difference.

4. A method of reading data associated with a programmed multi-bit ferroelectric memory device, comprising:

ascertaining a voltage associated with a polarization charge density of the programmed multi-bit ferroelectric memory device;

determining a state of the programmed multi-bit ferroelectric memory device based on a magnitude of a difference between the voltage associated with the polarization charge density and a reference voltage; and restoring the determined state to the sensed ferroelectric memory cell.

5. The method of claim 4, wherein the state is one of a plurality of states, wherein at least two of the plurality of states have voltages associated with differing polarization charge densities of the ferroelectric memory device biased in one polarization direction.

6. The method of claim 4, wherein determining the state further comprises considering a polarity of the magnitude difference in the state determination.

* * * * *